(12) United States Patent
Yun et al.

(10) Patent No.: US 12,543,481 B2
(45) Date of Patent: Feb. 3, 2026

(54) DISPLAY APPARATUS AND METHOD OF MANUFACTURING THE SAME

(71) Applicant: SAMSUNG DISPLAY CO., LTD., Yongin-si (KR)

(72) Inventors: Hyunkyung Yun, Yongin-si (KR); Cheuljin Park, Yongin-si (KR); Kisang Yoo, Yongin-si (KR); Joonik Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 308 days.

(21) Appl. No.: 18/133,181

(22) Filed: Apr. 11, 2023

(65) Prior Publication Data
US 2023/0329068 A1   Oct. 12, 2023

(30) Foreign Application Priority Data

Apr. 11, 2022   (KR) .................. 10-2022-0044833

(51) Int. Cl.
*H10K 59/80*   (2023.01)
*H10K 71/00*   (2023.01)

(52) U.S. Cl.
CPC ....... *H10K 59/873* (2023.02); *H10K 59/8792* (2023.02); *H10K 71/00* (2023.02)

(58) Field of Classification Search
CPC .. H10K 59/873; H10K 59/8792; H10K 71/00; H10K 59/12; H10K 59/872; H10K 50/844; H10K 50/865; H10K 59/1315; H10K 59/1201; H10K 59/1213; H10K 59/131; H10K 59/121; H10K 59/40; H10K 59/18; H10K 77/111; H10K 2102/311; H10D 86/441; H10D 86/451; H10D 86/60; H10H 29/142; H10H 20/01; H10H 20/857; G06F 3/0412; G06F 3/04164; G06F 3/0443; G06F 2203/04107; G06F 2203/04111; G06F 2203/04103; G06F 3/041; G06F 3/1446; G06F 3/147; H01L 25/18; H01L 23/60; H01L 27/0248; H01L 27/156; H01L 27/1214; H01L 27/3293; H01L 51/0097; H01L 2251/5338; H01L 27/3276; G09G 2380/02; G09G 3/3208; G09G 3/32; G09G 2300/026; G09G 2300/0426; G09F 9/301; G09F 9/33; Y02E 10/549

See application file for complete search history.

(56) References Cited

U.S. PATENT DOCUMENTS 9,792,867 B2 * 10/2017 Ohishi ................. G02F 1/1345
10,273,395 B2   4/2019 Lee et al.
(Continued)

FOREIGN PATENT DOCUMENTS

KR        101397707 B1    5/2014
KR   1020150005075 A    1/2015
(Continued)

*Primary Examiner* — Caleb E Henry
(74) *Attorney, Agent, or Firm* — CANTOR COLBURN LLP

(57) ABSTRACT

A display apparatus includes: a display panel including a display element; a protective film disposed under the display panel and including a first silicon-based compound; and a cover panel disposed under the protective film, where the cover panel includes a silicon layer including a second silicon-based compound.

9 Claims, 21 Drawing Sheets

(56) References Cited

U.S. PATENT DOCUMENTS

| | | | | |
|---|---|---|---|---|
| 10,361,223 | B2* | 7/2019 | Kim | H10D 89/911 |
| 10,496,134 | B2* | 12/2019 | Park | G06F 3/0412 |
| 10,503,297 | B2* | 12/2019 | Zeng | H04M 1/0266 |
| 10,575,403 | B2* | 2/2020 | Park | G02F 1/1333 |
| 11,430,963 | B2 | 8/2022 | Park et al. | |
| 11,594,692 | B2* | 2/2023 | Choi | H10K 59/131 |
| 2007/0291042 | A1* | 12/2007 | Kwak | G09G 3/3688 |
| | | | | 345/535 |
| 2007/0296659 | A1* | 12/2007 | Kwak | G02F 1/13452 |
| | | | | 349/56 |
| 2013/0001564 | A1* | 1/2013 | Choi | H10D 30/0316 |
| | | | | 257/40 |
| 2013/0228867 | A1* | 9/2013 | Suematsu | H01L 23/60 |
| | | | | 257/355 |
| 2014/0050909 | A1* | 2/2014 | Choi | C08L 83/10 |
| | | | | 428/313.9 |
| 2014/0117998 | A1* | 5/2014 | Hwang | G09G 3/006 |
| | | | | 324/511 |
| 2014/0217373 | A1* | 8/2014 | Youn | H10K 59/805 |
| | | | | 438/23 |
| 2014/0217382 | A1* | 8/2014 | Kwon | H10K 50/8426 |
| | | | | 257/40 |
| 2014/0353670 | A1* | 12/2014 | Youn | H10D 86/60 |
| | | | | 438/586 |
| 2014/0376135 | A1* | 12/2014 | Huo | H10D 89/711 |
| | | | | 361/56 |
| 2015/0036300 | A1* | 2/2015 | Park | H05K 1/147 |
| | | | | 156/212 |
| 2015/0103500 | A1* | 4/2015 | Bae | H05K 1/111 |
| | | | | 228/102 |
| 2015/0270287 | A1* | 9/2015 | Kim | H10D 86/441 |
| | | | | 257/40 |
| 2015/0380679 | A1* | 12/2015 | Fujiyoshi | H10K 59/873 |
| | | | | 438/26 |
| 2016/0044751 | A1* | 2/2016 | Ikeda | H05B 33/02 |
| | | | | 362/227 |
| 2016/0120045 | A1* | 4/2016 | Park | G02F 1/133308 |
| | | | | 361/752 |
| 2016/0172428 | A1* | 6/2016 | Song | H10K 59/131 |
| | | | | 257/40 |
| 2016/0174304 | A1* | 6/2016 | Kim | H10K 59/8792 |
| 2016/0209579 | A1* | 7/2016 | Park | G02B 6/0085 |
| 2016/0363722 | A1* | 12/2016 | Choi | G02B 6/0091 |
| 2016/0363803 | A1* | 12/2016 | Kim | G02F 1/133308 |
| 2016/0369131 | A1* | 12/2016 | Lim | G02B 1/14 |
| 2017/0069616 | A1* | 3/2017 | Cai | H10D 84/135 |
| 2017/0179112 | A1* | 6/2017 | Narita | H01L 23/5221 |
| 2017/0205571 | A1* | 7/2017 | Kim | G02B 6/009 |
| 2018/0090702 | A1* | 3/2018 | Um | H10K 77/111 |
| 2018/0184534 | A1* | 6/2018 | Na | F16B 5/07 |
| 2018/0301520 | A1* | 10/2018 | Jin | H10D 86/441 |
| 2019/0036066 | A1* | 1/2019 | Han | B32B 7/12 |
| 2019/0094641 | A1* | 3/2019 | Choi | G02F 1/133305 |
| 2019/0127608 | A1* | 5/2019 | Kim | H01L 21/6835 |
| 2019/0176435 | A1* | 6/2019 | Bellman | B32B 37/24 |
| 2019/0179591 | A1* | 6/2019 | Kuo | G06F 3/1446 |
| 2019/0281699 | A1* | 9/2019 | Bae | H05K 1/111 |
| 2019/0333978 | A1* | 10/2019 | Lee | H10K 77/111 |
| 2019/0346953 | A1* | 11/2019 | Peng | G09G 3/20 |
| 2019/0393443 | A1* | 12/2019 | Chen | H10K 77/111 |
| 2020/0161404 | A1* | 5/2020 | Kim | H05K 1/141 |
| 2020/0168684 | A1* | 5/2020 | Kim | H10K 59/124 |
| 2020/0176696 | A1* | 6/2020 | Dai | H10K 59/131 |
| 2020/0312236 | A1* | 10/2020 | Ma | G09G 3/3225 |
| 2020/0381648 | A1* | 12/2020 | Mun | G06F 1/1647 |
| 2020/0401185 | A1* | 12/2020 | Won | B32B 38/0004 |
| 2021/0083211 | A1* | 3/2021 | Park | H10K 50/80 |
| 2021/0122669 | A1* | 4/2021 | Lee | C08J 7/042 |
| 2021/0134910 | A1* | 5/2021 | Yang | H10D 86/441 |
| 2021/0265580 | A1* | 8/2021 | Jung | H10K 50/841 |
| 2022/0045301 | A1* | 2/2022 | Jang | H10K 59/122 |

FOREIGN PATENT DOCUMENTS

| | | |
|---|---|---|
| KR | 101625605 B1 | 6/2016 |
| KR | 1020170110214 A | 10/2017 |
| KR | 101833257 B1 | 4/2018 |
| KR | 1020190108396 A | 9/2019 |
| KR | 1020200101574 A | 8/2020 |
| KR | 1020220033574 A | 3/2022 |

* cited by examiner

DISPLAY APPARATUS AND METHOD OF MANUFACTURING THE SAME

This application claims priority to Korean Patent Application No. 10-2022-0044833, filed on Apr. 11, 2022, and all the benefits accruing therefrom under 35 U.S.C. § 119, the content of which in its entirety is herein incorporated by reference.

BACKGROUND

1. Field

One or more embodiments relate to a display apparatus and a method of manufacturing the same, and more particularly, to a display apparatus, in which adhesion between a protective film under a display panel and a cover panel is improved, and a method of manufacturing the same.

2. Description of the Related Art

A display apparatus may be an electronic apparatus, such as a mobile phone or a tablet personal computer ("PC"), or may be a portion of an electronic apparatus. The display apparatus provides visual information, such as an image or video, to a user. The display apparatus has also been developed with a structure in which a portion of a display is bent so that an image is displayed even at a side or a corner thereof. The display apparatus includes a display panel having a protective film bonded thereunder. The protective film may include a silicon-based compound so that the protective film is easily bent even at a side or a corner thereof.

SUMMARY

However, in such a conventional display apparatus, adhesion between a protective film disposed under a display panel and a cover panel disposed under the protective film to protect the display panel is low.

One or more embodiments include a display apparatus, in which adhesion between a protective film under a display panel and a cover panel is improved, and a method of manufacturing the same. However, this is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display apparatus includes: a display panel including a display element; a protective film disposed under the display panel and including a first silicon-based compound; and a cover panel disposed under the protective film, where the cover panel includes a silicon layer including a second silicon-based compound.

The first silicon-based compound and the second silicon-based compound may include the same material as each other.

The first silicon-based compound and the second silicon-based compound may include polydimethylsiloxane.

The second silicon-based compound may be different from the first silicon-based compound.

The first silicon-based compound may include polydimethylsiloxane.

The second silicon-based compound may include at least one of silica and silsesquioxane.

The cover panel may further include a cushion layer that is a foam layer disposed under the silicon layer and including a plurality of voids.

The cushion layer may include at least one of a urethane-based compound and an epoxy-based compound.

The cushion layer may include a light blocking material.

The cover panel may further include an organic layer disposed under the cushion layer, and the organic layer may include at least one of polyimide-based resin, acrylic resin, methacrylic resin, polyisoprene, vinyl-based resin, epoxy-based resin, urethane-based resin, cellulose-based resin, siloxane-based resin, polyamide-based resin, and perylene-based resin.

The cover panel may further include a metal layer disposed under the organic layer, and the metal layer may include at least one of copper, nickel, ferrite, silver, and aluminum.

According to one or more embodiments, a method of manufacturing a display apparatus includes: preparing a preliminary cover panel; bonding the preliminary cover panel under a protective film bonded under a display panel and including a first silicon-based compound; and thermally curing the preliminary cover panel, where the preparing of the preliminary cover panel includes: forming a preliminary cushion layer on an organic layer; forming a silicon-layer-forming layer by applying a silicon layer composition including a second silicon-based compound onto the preliminary cushion layer and performing heat treatment on the silicon layer composition; and forming a preliminary silicon layer by irradiating the silicon-layer-forming layer with ultraviolet light.

A temperature at which the preliminary cover panel is thermally cured may be lower than a temperature at which the heat treatment is performed on the silicon layer composition.

The first silicon-based compound and the second silicon-based compound may include the same material as each other.

The first silicon-based compound and the second silicon-based compound may include polydimethylsiloxane.

The second silicon-based compound may be different from the first silicon-based compound.

The first silicon-based compound may include polydimethylsiloxane.

The second silicon-based compound may include at least one of silica and silsesquioxane.

The forming of the preliminary cushion layer may include forming a cushion-layer-forming layer by applying a cushion layer composition onto the organic layer and performing heat treatment on the cushion layer composition; and forming the preliminary cushion layer by irradiating the cushion-layer-forming layer with ultraviolet light.

The thermally curing of the preliminary cover panel may include thermally curing the preliminary cushion layer and the preliminary silicon layer.

Other aspects, features, and advantages of the disclosure will become better understood through the detailed description, the claims, and the accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
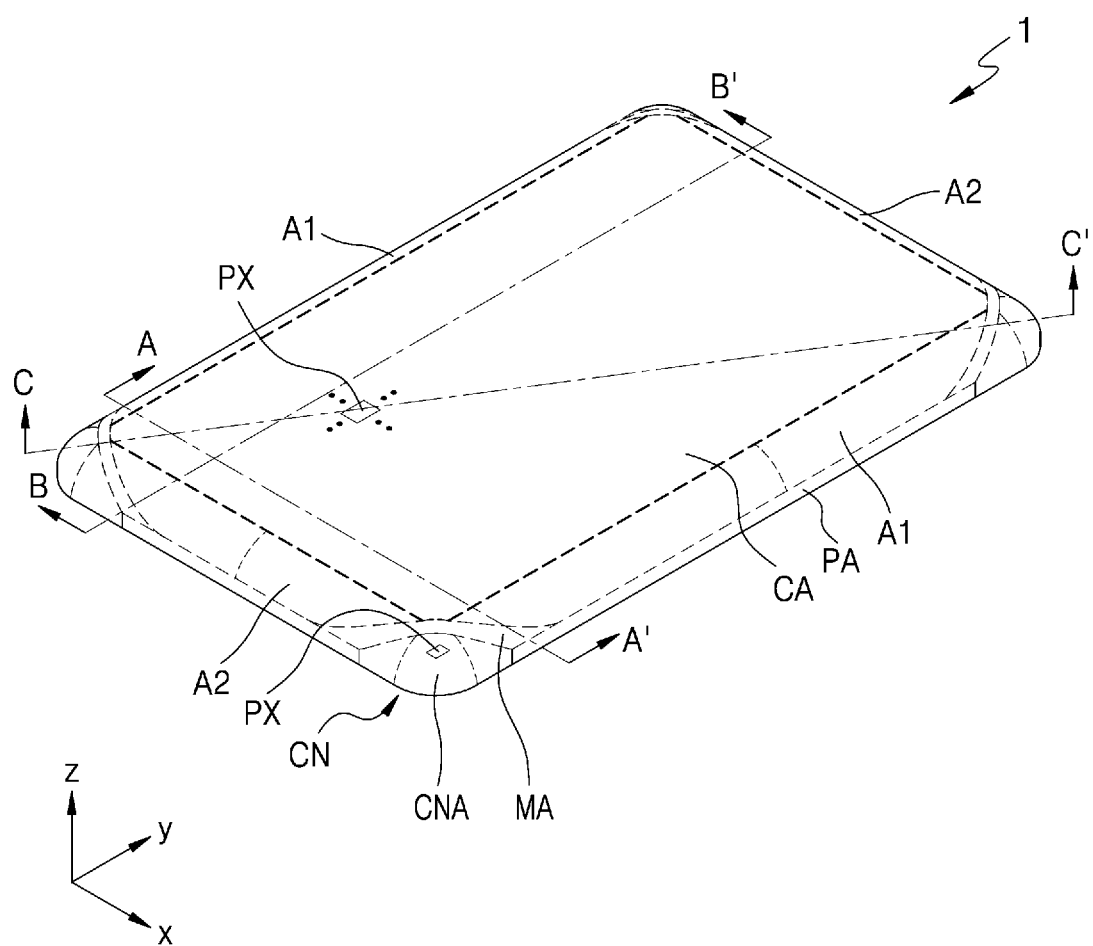
FIG. 1A is a perspective view schematically illustrating a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings. When describing embodiments with reference to the accompanying drawings, the same or corresponding elements are denoted by the same reference numerals, and redundant descriptions thereof will be omitted.

It will be understood that, when a layer, film, region, or plate is referred to as being "on" another element, the layer, film, region, or plate may be "directly on" the other element, and intervening elements may be present therebetween. Also, sizes of elements in the drawings may be exaggerated or reduced for convenience of explanation. For example, because sizes and thicknesses of elements in the drawings are arbitrarily illustrated for convenience of explanation, the disclosure is not limited thereto.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "include" and/or "comprise" used herein specify the presence of stated features or elements, but do not preclude the presence or addition of one or more other features or elements.

In this specification, the expression "A and/or B" indicates only A, only B, or both A and B. In this specification, the expression" at least one of A and B" indicates only A, only B, or both A and B.

Figure 1B:
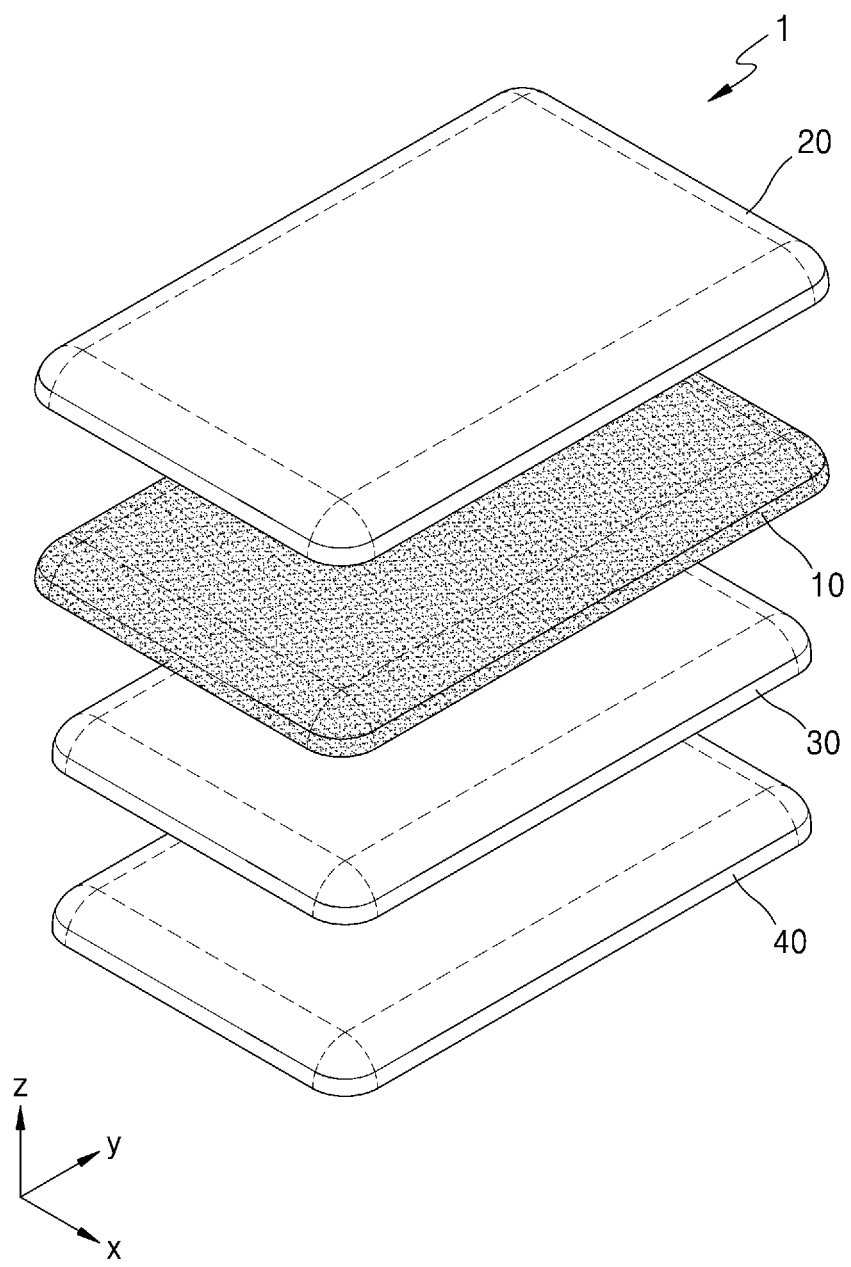
FIG. 1B is an exploded perspective view schematically illustrating a portion of the display apparatus according to an embodiment.
Figure 2A:
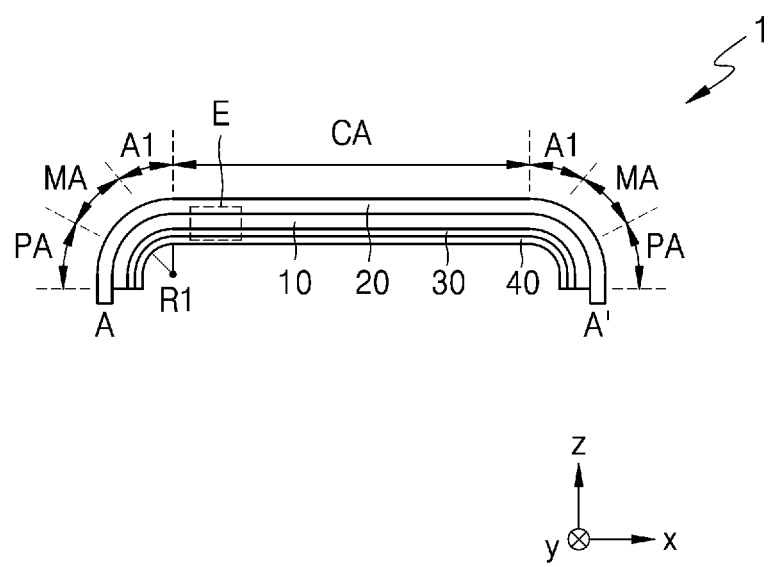
FIG. 2A is a cross-sectional view schematically illustrating a cross-section of the display apparatus taken along line A-A' of FIG. 1A, according to an embodiment.
Figure 2B:
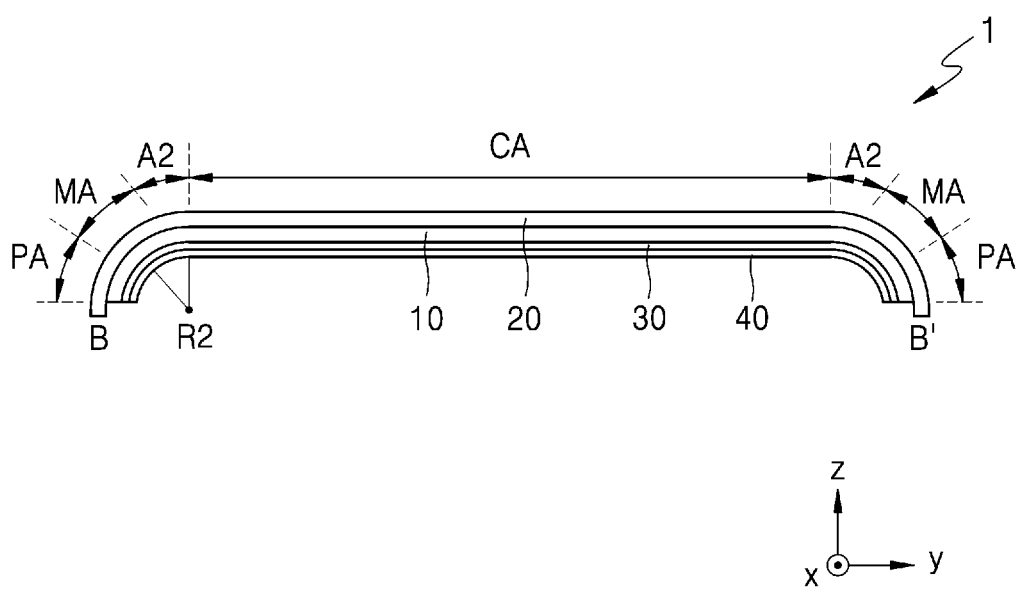
FIG. 2B is a cross-sectional view schematically illustrating a cross-section of the display apparatus taken along line B-B' of FIG. 1A, according to an embodiment.
Figure 2C:
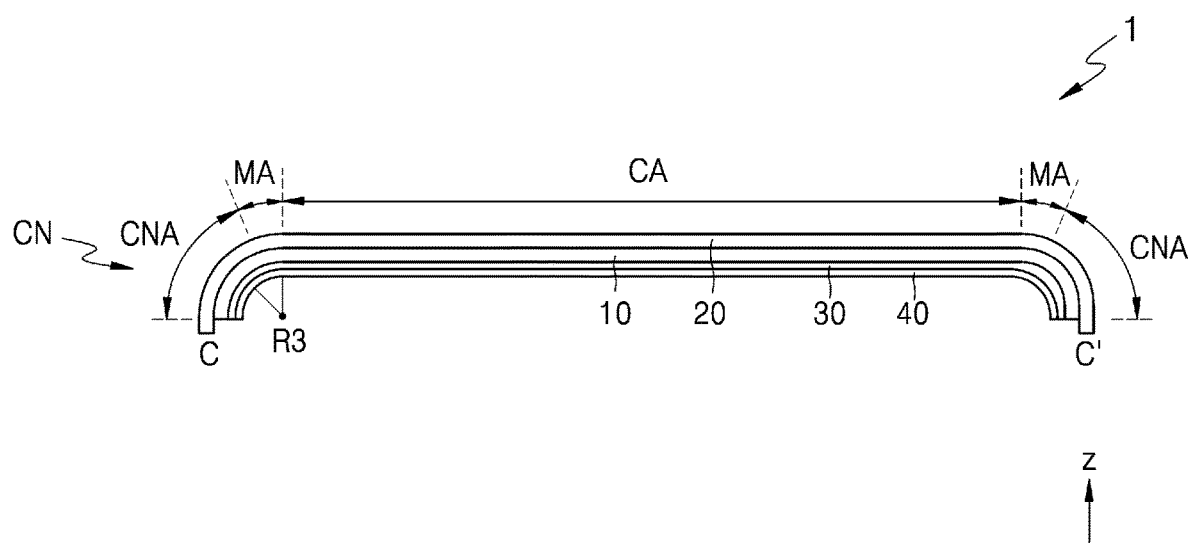
FIG. 2C is a cross-sectional view schematically illustrating a cross-section of the display apparatus taken along line C-C' of FIG. 1A, according to an embodiment.

FIG. 1A is a perspective view schematically illustrating a portion of a display apparatus 1 according to an embodiment, and FIG. 1B is an exploded perspective view schematically illustrating a portion of the display apparatus 1 according to an embodiment. FIG. 2A is a cross-sectional view schematically illustrating a cross-section of the display apparatus 1 taken along line A-A' of FIG. 1A, according to an embodiment, FIG. 2B is a cross-sectional view schematically illustrating a cross-section of the display apparatus 1 taken along line B-B' of FIG. 1A, according to an embodiment, and FIG. 2C is a cross-sectional view schematically illustrating a cross-section of the display apparatus 1 taken along line C-C' of FIG. 1A, according to an embodiment.

The display apparatus 1 is configured to display a moving image or a still image. The display apparatus 1 may include portable electronic apparatuses, such as mobile phones, smartphones, tablet personal computers (PCs), mobile communication terminals, electronic organizers, e-books, portable multimedia players ("PMPs"), navigations, or ultra mobile PCs ("UMPCs"). The display apparatus 1 may also include electronic apparatuses, such as televisions, laptops, monitors, billboards, and Internet of things ("IoT") devices. Alternatively, the display apparatus 1 may include wearable devices, such as smart watches, watch phones, glass-type displays, or head mounted displays ("HMDs"). Alternatively, the display apparatus 1 may be a portion of another apparatus. For example, the display apparatus 1 may be a display of an electronic apparatus. Alternatively, the display apparatus 1 may be used in dashboards of automobiles, center information displays ("CIDs") on the center fascia or dashboards of automobiles, room mirror displays replacing side mirrors of automobiles, and displays on the rear sides of front seats to serve as entertainment devices for backseat passengers of automobiles.

Referring to FIGS. 1A, 1B, and 2A to 2C, the display apparatus 1 capable of displaying an image may have an edge extending in a first direction and an edge extending in a second direction. The first direction and the second direction may cross each other. For example, the first direction the second direction may form an acute angle. Alternatively, the first direction and the second direction may form an obtuse angle or a right angle. Hereinafter, for convenience, it is assumed that the first direction is perpendicular to the second direction. For example, the first direction may be the x direction or the −x direction, and the second direction may be the y direction or the −y direction.

A corner CN in which the edge extending in the first direction (e.g., the x direction or the −x direction) meets the edge extending in the second direction (e.g., the y direction or the −y direction) may have a certain curvature.

As illustrated in FIGS. 1B and 2A to 2C, the display apparatus 1 may include a display panel 10, a cover window 20, a protective film 30, and a cover panel 40. The display apparatus 1 may include a central area CA, a first area A1, a second area A2, a corner area CNA, a middle area MA, and a peripheral area PA. The central area CA may be a flat area. The central area CA of the display apparatus 1 may provide most of the image.

The first area A1 may be adjacent to the central area CA in the first direction (e.g., the x direction or the −x direction). The first area A1 may extend in the second direction (e.g., the y direction or the −y direction). The display apparatus 1 may be bent in the first area A1. That is, the first area A1 may be defined as a region bent from the central area CA in the cross section (e.g., an zx-cross section) in the first direction. On the other hand, the first area A1 may not be bent in a cross section (e.g., an yz-cross section) in the second direction. That is, the first area A1 may be an area that is bent about an axis extending in the second direction.

FIG. 2A illustrates that the first area A1 located in the x direction from the central area CA and the first area A1 located in the −x direction from the central area CA have the same curvature as each other, but the disclosure is not limited thereto. For example, the first area A1 located in the x direction from the central area CA and the first area A1 located in the −x direction from the central area CA may have different curvatures from each other in another embodiment.

The second area A2 may be adjacent to the central area CA in the second direction. The second area A2 may extend in the first direction. The display apparatus 1 may be bent in the second area A2. That is, the second area A2 may be defined as a region bent from the central area CA in the cross section (e.g., an yz-cross section) in the second direction. On the other hand, the second area A2 may not be bent in the cross section (e.g., the xz-cross section) in the first direction. That is, the second area A2 may be an area that is bent about an axis extending in the first direction.

FIG. 2B illustrates that the second area A2 located in the y direction from the central area CA and the second area A2 located in the −y direction from the central area CA have the same curvature as each other, but the disclosure is not limited thereto. For example, the second area A2 located in the y direction from the central area CA and the second area A2 located in the −y direction from the central area CA may have different curvatures from each other in another embodiment.

The display apparatus 1 may bent in the corner area CNA. The corner area CNA may be an area at the corner CN of the display apparatus 1. That is, the corner area CNA may be an area in which the edge of the display apparatus 1 extending in the first direction meets the edge of the display apparatus 1 extending in the second direction. The corner area CNA may at least partially surround the central area CA, the first area A1, and the second area A2. Alternatively, the corner area CNA may at least partially surround the central area CA, the first area A1, the second area A2, and the middle area MA.

As described above, when the first area A1 extends in the second direction and is bent in the cross-section (e.g., the zx cross-section) in the first direction and the second area A2 extends in the first direction and is bent in the cross-section (e.g., the yz cross-section) in the second direction, at least a portion of the corner area CNA may be bent in both the cross-section (e.g., the zx cross-section) in the first direction and the cross-section (e.g., the yz cross-section) in the second direction. That is, at least a portion of the corner area CNA may be curved areas in which a plurality of curvatures in a plurality of directions overlap each other. The display apparatus 1 may have a plurality of corner areas CNA.

The middle area MA may be between the central area CA and the corner area CNA. The middle area MA may extend between the first area A1 and the corner area CNA in an extending direction of the first area A1. Of course, the middle area MA may extend between the second area A2 and the corner area CNA in an extending direction of the second area A2. The middle area MA may be bent. A driving circuit configured to provide an electrical signal to a pixel PX may be arranged in the middle area MA. Also, a power line configured to provide power to the pixel PX may be arranged in the middle area MA. The pixel PX arranged in the middle area MA may overlap the driving circuit and/or the power line.

The peripheral area PA may be outside the central area CA. Specifically, the peripheral area PA may be outside the first area A1 and the second area A2. The peripheral area PA may be bent. The pixel PX is not arranged in the peripheral area PA. That is, the peripheral area PA may be a non-display area in which an image is not displayed. A driving circuit configured to provide an electrical signal to the pixel PX or a power line configured to provide power to the pixel PX may be arranged in the peripheral area PA.

As illustrated in FIG. 2A, a portion of the peripheral area PA, the middle area MA, and the first area A1 may be bent with a first radius R1 of curvature. As illustrated in FIG. 2B, another portion of the peripheral area PA, the middle area MA, and the second area A2 may be bent with a second radius R2 of curvature. Of course, as illustrated in FIG. 2C, the corner area CNA and the middle area MA may be bent with a third radius R3 of curvature.

The pixel PX may be implemented as a display element. The pixels PX may each include a red sub-pixel, a green sub-pixel, and a blue sub-pixel. Alternatively, the pixels PX may each include a red sub-pixel, a green sub-pixel, a blue sub-pixel, and a white sub-pixel.

The pixel PX may be arranged in at least one of the central area CA, the first area A1, the second area A2, the corner area CNA, and the middle area MA. For example, the pixels PX may be arranged in the central area CA, the first area A1, the second area A2, the corner area CNA, and the middle area MA. Accordingly, the display apparatus 1 may display an image in the central area CA, the first area A1, the second area A2, the corner area CNA, and the middle area MA. The display apparatus 1 may provide independent images in the central area CA, the first area A1, the second area A2, the corner area CNA, and the middle area MA. Alternatively, the display apparatus 1 may provide portions of one image in the central area CA, the first area A1, the second area A2, the corner area CNA, and the middle area MA.

As such, the display apparatus 1 may display an image not only in the central area CA but also in the first area A1, the second area A2, the middle area MA, and the corner area CNA. Accordingly, the area occupied by the display area of the display apparatus 1, which is an area through which an image is displayed, may be remarkably increased. Also, because the display apparatus 1 is capable of displaying an image even in the bent corner CN, the aesthetic sense may be improved.

The cover window 20 may be disposed on the upper surface (the +z direction) of the display panel 10. The upper surface of the display panel 10 may be defined as a surface facing a direction in which the display panel 10 provides an image.

According to an embodiment, the cover window 20 may be disposed to cover the upper surface of the display panel 10. The cover window 20 may protect the upper surface of the display panel 10. Also, because the cover window 20 defines the outer appearance of the display apparatus 1, the cover window 20 may include a flat surface and a curved surface corresponding to the shape of the display apparatus 1.

The cover window 20 may be bonded to the display panel 10 by an adhesive layer (not illustrated). The adhesive layer may include, for example, an adhesive member, such as an optical clear adhesive ("OCA") or a pressure sensitive adhesive ("PSA").

The cover window 20 may have high transmittance in order to transmit light emitted from the display panel 10, and may have a small thickness in order to minimize the weight of the display apparatus 1. Also, the cover window 20 may have strong strength and hardness in order to protect the display panel 10 from external impact. The cover window 20 may be a flexible window. The cover window 20 may be easily bent according to an external force, without generating cracks, to protect the display panel 10.

The cover window 20 may include glass, sapphire, or plastic. In an embodiment, the cover window 20 may include, for example, colorless polyimide ("CPI") or Ultra-Thin Glass (UTG®), the strength of which is strengthened by chemical strengthening or thermal strengthening. In an embodiment, the cover window 20 may have a structure in which a flexible polymer layer is disposed on one surface of a glass substrate, or may include only a polymer layer. An image, which is displayed by the display panel 10, may be provided to a user through the transparent cover window 20. That is, an image, which is provided by the display apparatus 1, may be understood as being implemented by the display panel 10. Accordingly, the central area CA, the first area A1, the second area A2, the corner area CNA, the middle area MA, and the peripheral area PA of the display apparatus 1 described above may be understood as being provided in the display panel 10.

The protective film 30 may be disposed under the display panel 10 to face the lower surface (the −z direction) of the display panel 10. Specifically, the protective film 30 may be disposed under the substrate 100 to face the lower surface (the −z direction) of the substrate 100. The protective film 30 may protect the display panel 10 in the process of manufacturing the display apparatus 1. The protective film 30 may include a first silicon-based compound. The first silicon-based compound may include a silicon-containing organosilicon compound. Specifically, the first silicon-based compound may include a siloxane-based polymer material. For example, the first silicon-based compound may include polydimethylsiloxane.

When the protective film 30 includes polyethylene terephthalate ("PET"), the modulus of the protective film 30 is high, and thus, the molding of the protective film 30 may not be facilitated. However, in the case of the display apparatus 1 according to the present embodiment, because the protective film 30 includes a silicon-based material, the modulus of the protective film 30 is low and the shape of the protective film 30 may be easily deformed even with a small force. Accordingly, the protective film 30 may be easily molded.

Although not illustrated, an adhesive layer may be between the protective film 30 and the substrate 100. The protective film 30 may be bonded under the substrate 100 by the adhesive layer. The adhesive layer between the protective film 30 and the substrate 100 may include at least one of an optical clear resin ("OCR"), an OCA, and a PSA.

The adhesive layer between the protective film 30 and the substrate 100 may further include a silicon-based material. For example, the adhesive layer between the protective film 30 and the substrate 100 may include a PSA containing a silicon-based material. Because the adhesive layer between the protective film 30 and the substrate 100 includes a silicon-based material, adhesion between the protective film 30 and the adhesive layer may increase. That is, because the adhesive layer includes a material having properties similar to those of the silicon-based material included in the protective film 30, adhesion between the protective film 30 and the adhesive layer may increase.

The cover panel 40 may be disposed under the display panel 10. Specifically, the cover panel 40 may be disposed under the protective film 30 bonded to the display panel 10, and the protective film 30 may be between the display panel 10 and the cover panel 40. In this case, the cover panel 40 may protect the display panel 10 from the outside and may absorb impact applied from the cover window 20 or the like. The cover panel 40 may include a metal layer, an organic layer, a cushion layer, and a light blocking layer. Details of the metal layer, the organic layer, the cushion layer, and the light blocking layer will be described below.

Figure 3:
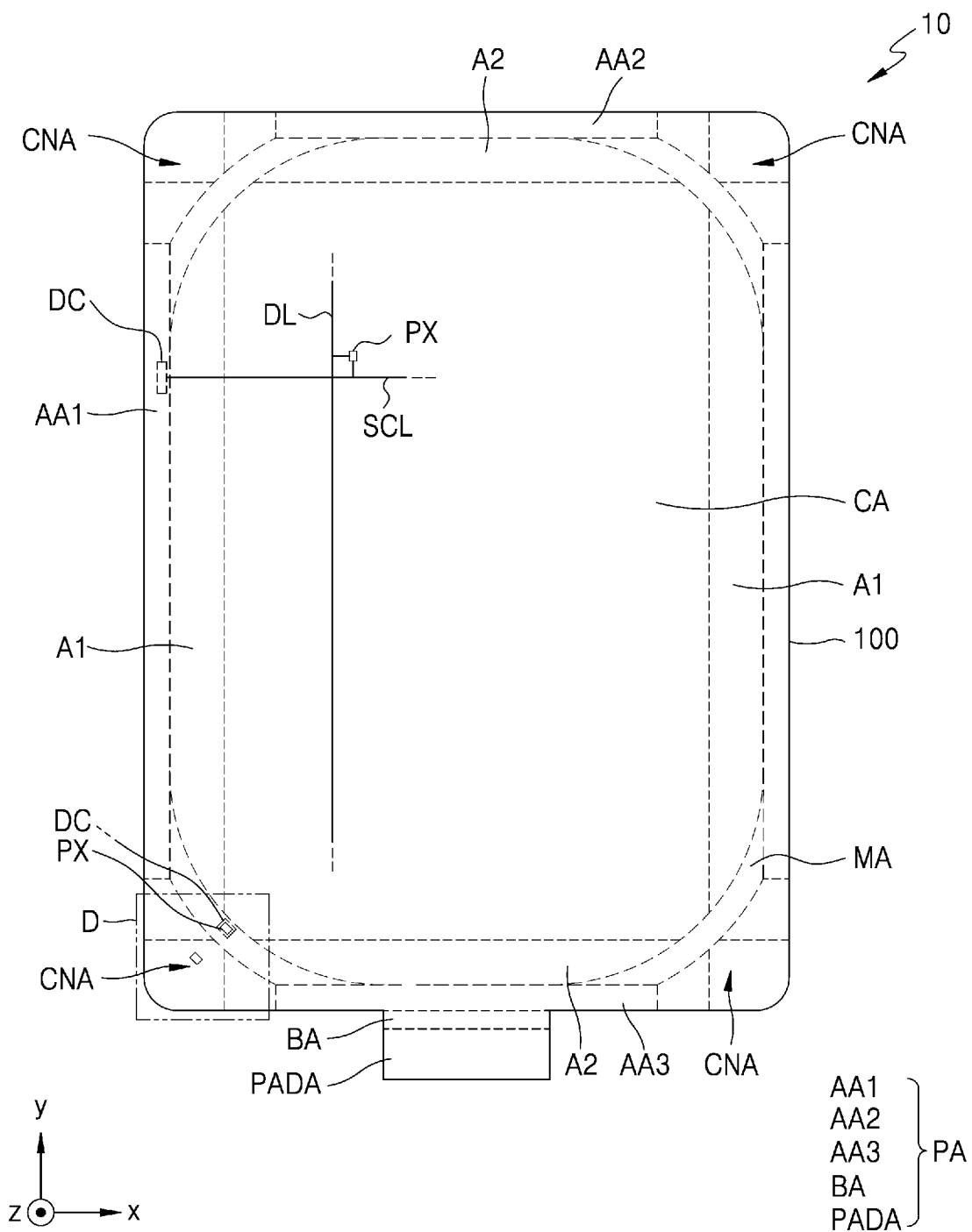
FIG. 3 is a plan view schematically illustrating a display panel that is a portion of the display apparatus of FIG. 1A, according to an embodiment.

FIG. 3 is a plan view schematically illustrating the display panel 10 that is a portion of the display apparatus 1 of FIG. 1A, according to an embodiment. FIG. 3 schematically illustrates a state in which the display panel 10 is unbent.

As described above, the peripheral area PA may be outside the central area CA. The peripheral area PA may include a first adjacent area AA1, a second adjacent area AA2, a third adjacent area AA3, a bending area BA, and a pad area PADA.

The first adjacent area AA1 may be outside the first area A1. That is, the first area A1 may be between the first adjacent area AA1 and the central area CA. Accordingly, the first adjacent area AA1 may be located in the first direction from the first area A1, and may extend in the second direction, like the first area A1. A driving circuit DC and/or a power line may be arranged in the first adjacent area AA1.

The second adjacent area AA2 and the third adjacent area AA3 may be outside the second area A2. That is, the second areas A2 may be between the second adjacent area AA2 and the central area CA and between the third adjacent area AA3 and the central area CA. The second adjacent area AA2 and the third adjacent area AA3 may extend in the first direction, like the second area A2. The second areas A2 and the central area CA may be between the second adjacent area AA2 and the third adjacent area AA3.

The bending area BA may be outside the third adjacent area AA3. That is, the third adjacent area AA3 may be between the bending area BA and the second area A2. The pad area PADA may be outside the bending area BA. That is, the bending area BA may be between the third adjacent area AA3 and the pad area PADA. The display panel 10 may be bent in the bending area BA. In this case, the pad area PADA may be disposed to overlap other portions of the display panel 10 in a plan view. Accordingly, the area of the peripheral area PA visible to the user may be minimized. A pad (not illustrated) may be arranged in the pad area PADA. The display panel 10 may be configured to receive an electrical signal and/or a power supply voltage through the pad.

Although FIG. 3 illustrates a state in which the display panel 10 is unbent, a portion of the display panel 10 may be bent, as described above. That is, at least one of the first area A1, the second area A2, the corner area CNA, and the middle area MA may be bent.

Specifically, because the first area A1 is bent about an axis extending in the second direction, the first area A1 is bent in the cross-section (e.g., the zx cross-section) in the first direction and is not bent in the cross-section (e.g., the yz cross-section) in the second direction. Because the second area A2 is bent about an axis extending in the first direction, the second area A2 is bent in the cross-section (e.g., the yz cross-section) in the second direction and is not bent in the cross-section (e.g., the zx cross-section) in the first direction. Because at least a portion of the corner area CNA is bent in both the cross-section (e.g., the zx cross-section) in the first direction and the cross-section (e.g., the yz cross-section) in the second direction, at least a portion of the corner area CNA may be curved areas in which a plurality of curvatures in a plurality of directions overlap each other in a plan view.

When the corner area CNA is bent as described above, compressive strain may be greater than tensile strain in the corner area CNA. Therefore, it is desirable to apply a structure, such as the contractible substrate 100, to at least a portion of the corner area CNA. As a result, the structure of the display panel 10 in the corner area CNA may be different from the structure of the display panel 10 in the central area CA.

As described above, the pixel PX that may be arranged in at least one of the central area CA, the first area A1, the second area A2, the corner area CNA, and the middle area MA may include a display element. Examples of the display element may include an organic light-emitting diode ("OLED") including an organic emission layer. Alternatively, examples of the display element may include a light-emitting diode (LED) including an inorganic emission layer. The size of the LED may be on a micro scale or a nano scale. Examples of the LED may include a micro LED. Alternatively, examples of the LED may include a nanorod LED. The nanorod LED may include gallium nitride (GaN). A color conversion layer may be disposed on the display element. In this case, the color conversion layer may include quantum dots. Alternatively, examples of the display element may include a quantum dot LED including a quantum dot emission layer. Hereinafter, for convenience, a case where the display element includes an OLED will be described.

The pixel PX may include a plurality of sub-pixels. Each of the sub-pixels may emit light of a certain color by using the display element. The sub-pixel is a minimum unit for implementing an image and refers to an emission area. When the OLED is employed as the display element, the emission area may be defined by an opening of a pixel defining layer. This will be described below.

A driving circuit DC may be configured to provide a signal to the pixels PX. For example, the driving circuit DC may be a scan driving circuit configured to provide scan signals through scan lines SCL to pixel circuits electrically connected to the sub-pixels included in the pixel PX. Alternatively, the driving circuit DC may be an emission control driving circuit configured to provide emission control signals through emission control lines (not illustrated) to the pixel circuits electrically connected to the sub-pixels. Alternatively, the driving circuit DC may be a data driving circuit configured to provide data signals through data lines DL to the pixel circuits electrically connected to the sub-pixels. Although not illustrated, the data driving circuit may be arranged in the third adjacent area AA3 or the pad area PADA. Alternatively, the data driving circuit may be disposed on a display circuit board connected through a pad.

Figure 4:
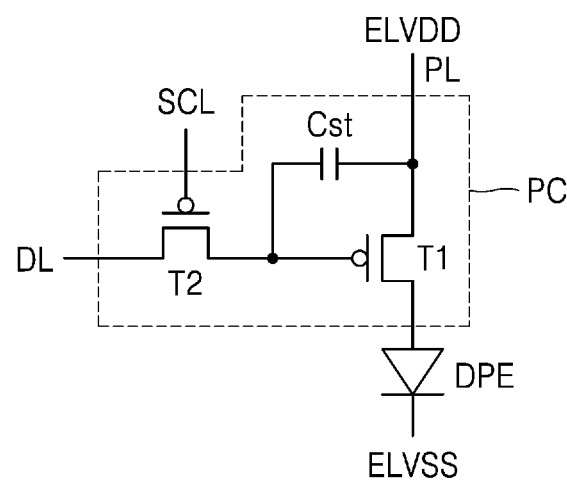
FIG. 4 is an equivalent circuit diagram illustrating an example of a pixel circuit included in the display apparatus of FIG. 1A, according to an embodiment.

FIG. 4 is an equivalent circuit diagram illustrating an example of a pixel circuit PC included in the display apparatus 1 of FIG. 1A, according to an embodiment. That is, FIG. 4 is an equivalent circuit diagram of the pixel circuit PC electrically connected to an OLED, which is a display element DPE forming a pixel included in the display apparatus 1 of FIG. 1A. The pixel circuit PC, which is electrically connected to a sub-pixel, may include a driving thin-film transistor T1, a switching thin-film transistor T2, and a storage capacitor Cst. In an embodiment, the display element DPE may emit red light, green light, or blue light, or may emit red light, green light, blue light, or white light.

The switching thin-film transistor T2 may be connected to a scan line SCL and a data line DL, and may be configured to transmit, to the driving thin-film transistor T1, a data signal or a data voltage input from the data line DL in response to a scan signal or a switching voltage input from the scan line SCL.

The storage capacitor Cst may be connected to the switching thin-film transistor T2 and a driving voltage line PL, and may be configured to store a voltage corresponding to a difference between a voltage received from the switching thin-film transistor T2 and a first power supply voltage ELVDD supplied to the driving voltage line PL.

The driving thin-film transistor T1 may be connected to the driving voltage line PL and the storage capacitor Cst, and may be configured to control a driving current flowing from the driving voltage line PL to the OLED according to a voltage value stored in the storage capacitor Cst. The display element DPE may emit light having a certain luminance according to the driving current. An opposite electrode of the display element DPE may be configured to receive a second power supply voltage ELVSS.

Although FIG. 4 illustrates that the pixel circuit PC includes two thin-film transistors and one storage capacitor, the pixel circuit PC may include three or more thin-film transistors.

Figure 5:
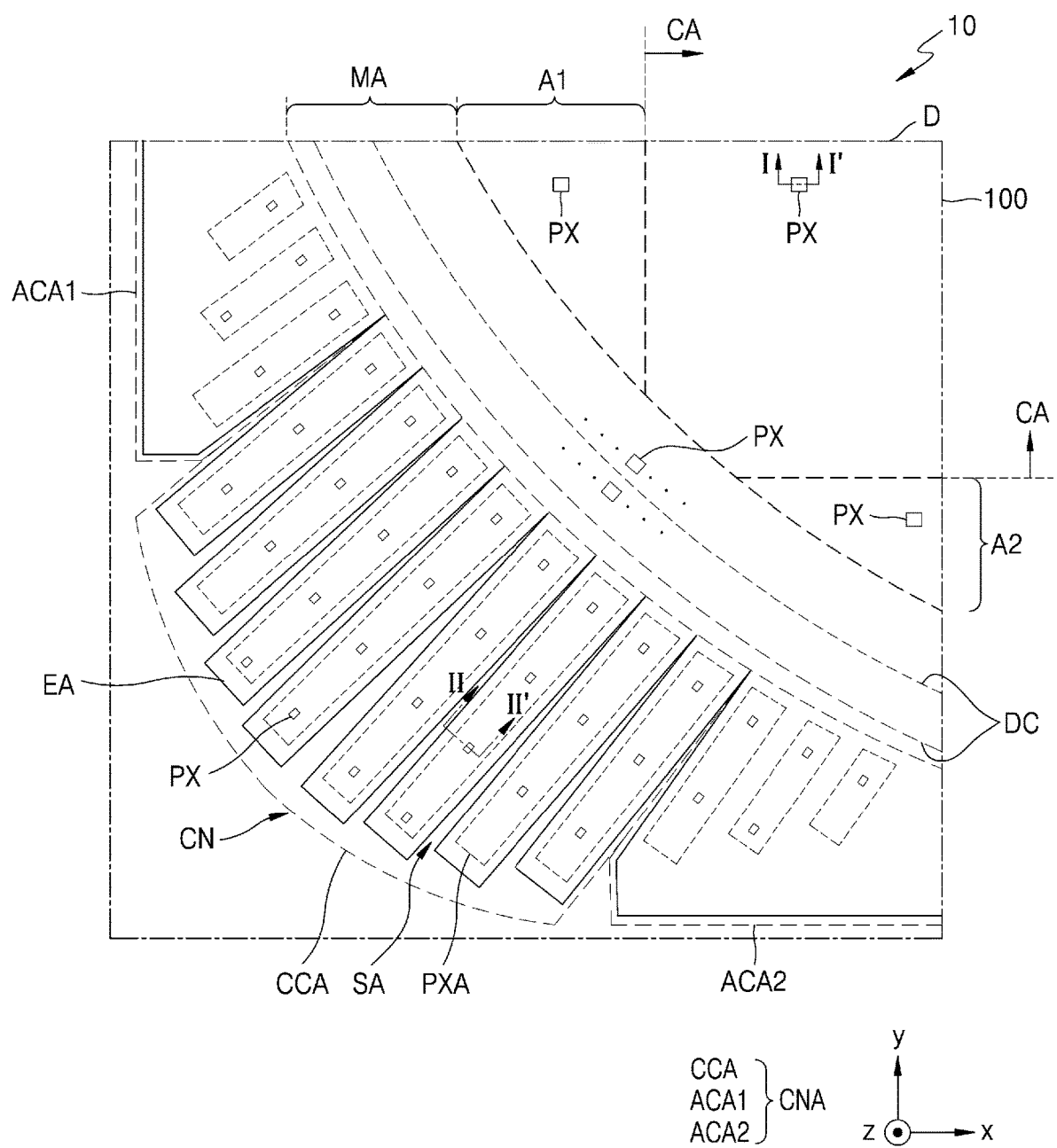
FIG. 5 is an enlarged conceptual diagram of portion D of FIG. 3, according to an embodiment.
Figure 6:
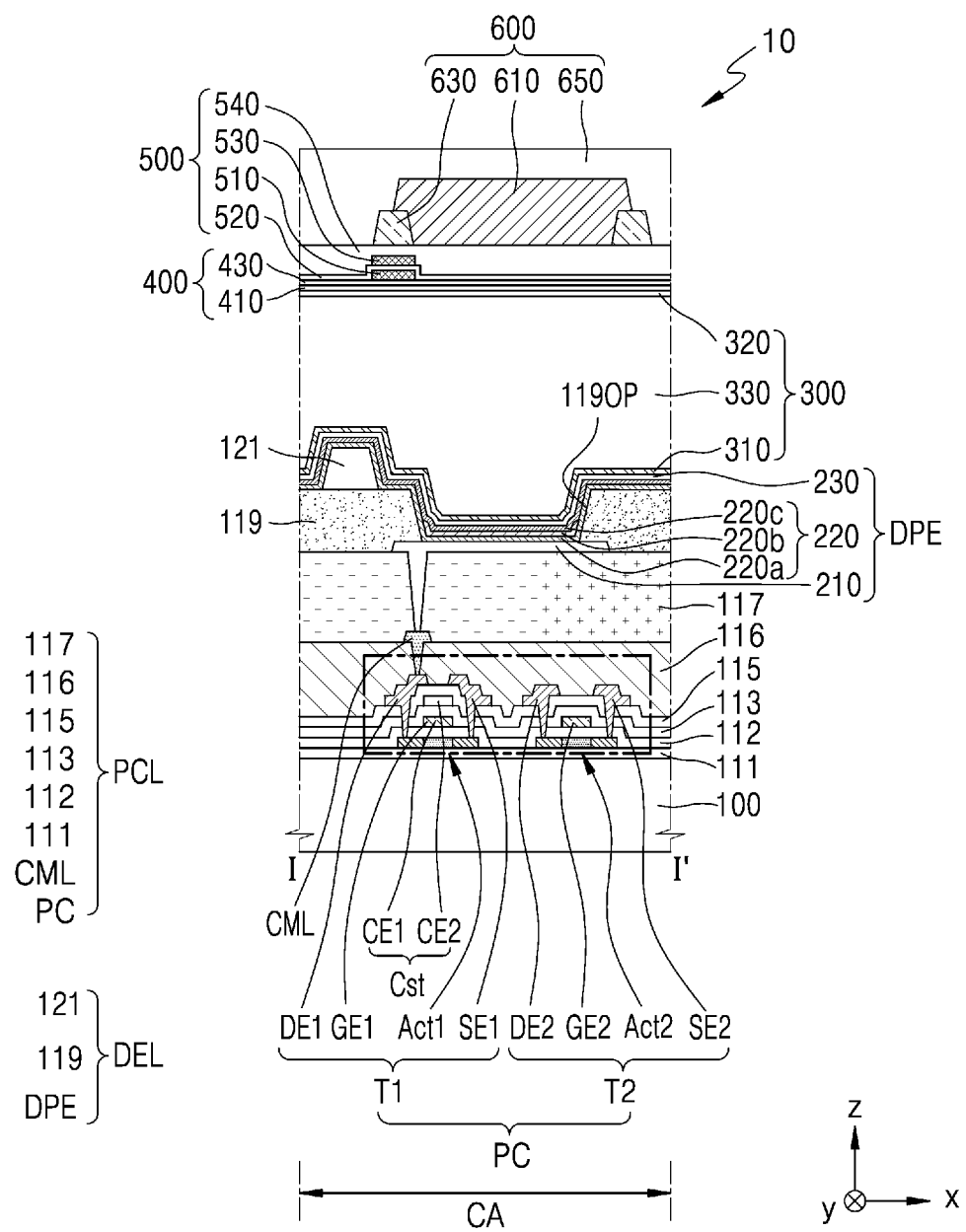
FIG. 6 is a cross-sectional view schematically illustrating a cross-section of the display apparatus taken along line I-I' of FIG. 5, according to an embodiment.

FIG. 5 is an enlarged conceptual diagram of portion D of FIG. 3, according to an embodiment, and FIG. 6 is a cross-sectional view schematically illustrating a cross-section of the display apparatus 1 taken along line I-I' of FIG. 5, according to an embodiment.

As illustrated in FIGS. 5 and 6, the display panel 10 included in the display apparatus 1 may include a substrate 100, a pixel circuit layer PCL, a display element layer DEL, an encapsulation layer 300, a protective layer 400, and a touch sensor layer 500, and an anti-reflection layer 600.

The substrate 100 may include a central area CA, a first area A1, a second area A2, a corner area CNA, and a middle area MA. In other words, because the display panel 10 includes the substrate 100, the central area CA, the first area A1, the second area A2, the corner area CNA, the middle area MA, and a peripheral area PA may be defined on the substrate 100.

The first area A1 may be adjacent to the central area CA in the first direction (e.g., the x direction or the −x direction). The first area A1 may extend in the second direction (e.g., the y direction or the −y direction). The second area A2 may be adjacent to the central area CA in the second direction. The second area A2 may extend in the first direction.

The corner area CNA may be an area at a corner CN of the display panel 10. That is, the corner area CNA may be an area in which an edge of the display panel 10 extending in the first direction meets an edge of the display panel 10 extending in the second direction. The corner area CNA may at least partially surround the central area CA, the first area A1, and the second area A2. Alternatively, the corner area CNA may at least partially surround the central area CA, the first area A1, the second area A2, and the middle area MA. The corner area CNA may include a central corner area CCA, a first adjacent corner area ACA1, and a second adjacent corner area ACA2.

The central corner area CCA may include an extension area EA. The extension area EA may extend in a direction away from the central area CA. The display panel 10 may include a plurality of extension areas EA. Each of the extension areas EA may extend in a direction away from the central area CA. For example, the extension areas EA may extend in a direction crossing the first direction (e.g., the x direction or the −x direction) and the second direction (e.g., the y direction or the −y direction).

A separation area SA may be defined between the adjacent extension areas EA. The separation area SA may be an area in which elements of the display panel 10 are not arranged. When the central corner area CCA is bent at the corner CN, compressive strain may be greater than tensile strain in the central corner area CCA. However, because the separation area SA is defined between the adjacent extension areas EA, the display panel 10 may be bent without being damaged in the central corner area CCA.

The first adjacent corner area ACA1 may be adjacent to the central corner area CCA. At least a portion of the first area A1 and the first adjacent corner area ACA1 may be located in the first direction (e.g., the x direction or the −x direction). An end portion of the first adjacent corner area ACA1 in the direction of the central corner area CCA may be apart from an end portion of the central corner area CCA in the direction of the first adjacent corner area ACA1. The first adjacent corner area ACA1 is bent in the cross-section (the zx cross-section) in the first direction, and is not bent in the cross-section (the yz cross-section) in the second direction. The separation area SA may not be defined in the first adjacent corner area ACA1.

The second adjacent corner area ACA2 may also be adjacent to the central corner area CCA. At least a portion of the second area A2 and the second adjacent corner area ACA2 may be located in the second direction (e.g., the y direction or the −y direction). An end portion of the second adjacent corner area ACA2 in the direction of the central corner area CCA may be apart from an end portion of the central corner area CCA in the direction of the second adjacent corner area ACA2. The second adjacent corner area ACA2 is not bent in the cross-section (the zx cross-section) in the first direction, and is bent in the cross-section (the yz cross-section) in the second direction. The separation area SA may not be defined in the second adjacent corner area ACA2.

The middle area MA may be between the central area CA and the corner area CNA. The middle area MA may extend between the central area CA and the first adjacent corner area ACA1. Also, the middle area MA may extend between the central area CA and the second adjacent corner area ACA2. The middle area MA may at least partially surround the central area CA, the first area A1, and the second area A2.

As illustrated in FIG. 5, the pixels PX may be arranged in the central area CA, the first area A1, the second area A2, the corner area CNA, and the middle area MA. Accordingly, the display panel 10 may display an image in the central area CA, the first area A1, the second area A2, the corner area CNA, and the middle area MA. The extension areas EA may each include a pixel area PXA, and the pixels PX may be arranged in the pixel area PXA. In each of the extension areas EA, the pixels PX may be arranged in the extending direction of the extension areas EA. The pixel PX may include a display element DPE.

A driving circuit configured to provide an electrical signal to the pixel PX and/or a power line configured to supply power to the pixel PX may be arranged in the middle area MA. A plurality of driving circuits DC may be provided. The driving circuits DC may extend in the extending direction of the middle area MA. The driving circuit DC may at least partially surround the central area CA, the first area A1, and the second area A2.

The pixel PX in the middle area MA may overlap the driving circuit DC and/or the power line. In this case, the middle area MA may function as a display area even when the driving circuit DC and/or the power line are arranged therein. However, the disclosure is not limited thereto. For example, the driving circuit DC and/or the power line may not be arranged in the middle area MA in another embodiment. In this case, the pixel PX in the middle area MA may not overlap the driving circuit DC and/or the power line in a plan view.

The substrate 100 may include polymer resin, such as polyethersulfone, polyarylate, polyetherimide, polyethylene naphthalate, PET, polyphenylene sulfide, polyimide, polycarbonate, cellulose triacetate, or cellulose acetate propionate. Alternatively, the substrate 100 may include two layers including the polymer resin described above, and a barrier layer between the two layers. In this case, the barrier layer may include an inorganic material, such as silicon nitride ($SiN_x$), silicon oxide ($SiO_2$), and/or silicon oxynitride (SiON). Of course, the substrate 100 may include glass or metal.

The pixel circuit layer PCL may be disposed on the substrate 100. The pixel circuit layer PCL may include a pixel circuit PC, a buffer layer 111, a first gate insulating layer 112, a second gate insulating layer 113, an interlayer insulating layer 115, a first planarization layer 116, a second planarization layer 117, and a connection electrode CML. The pixel circuit PC may include at least one thin-film transistor. Specifically, the pixel circuit PC may include a driving thin-film transistor T1, a switching thin-film transistor T2, and a storage capacitor Cst.

The driving thin-film transistor T1 may include a first semiconductor layer Act1, a first gate electrode GE1, a first source electrode SE1, and a first drain electrode DE1. The pixel circuit layer PCL may further include the buffer layer 111, the first gate insulating layer 112, the second gate insulating layer 113, the interlayer insulating layer 115, the first planarization layer 116, and the second planarization layer 117, which are disposed above and/or below the elements of the driving thin-film transistor T1.

The buffer layer 111 may reduce or prevent infiltration of foreign material, moisture, or ambient air from below the substrate 100, and may provide a flat surface on the substrate 100. The buffer layer 111 may include an inorganic material, such as an oxide or a nitride, an organic material, an organic/inorganic composite material, and may have a single-layer structure or a multilayer structure including an inorganic material and an organic material.

The first semiconductor layer Act1 may be disposed on the buffer layer 111. The first semiconductor layer Act1 may include polysilicon. Alternatively, the first semiconductor layer Act may include amorphous silicon, an oxide semiconductor, or an organic semiconductor. The first semiconductor layer Act1 may include a channel region, and a drain region and a source region on opposite sides of the channel region, respectively.

The first gate electrode GE1 may overlap the channel region in a plan view. The first gate electrode GE1 may include a low-resistance metal material. The first gate electrode GE1 may include a conductive material including molybdenum (Mo), aluminum (Al), copper (Cu), titanium (Ti), and the like, and may include a single layer or layers including the conductive material described above.

The first gate insulating layer 112 may be between the first semiconductor layer Act1 and the first gate electrode GE1. The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$).

The second gate insulating layer 113 may cover the first gate electrode GE1. The second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$).

A second capacitor electrode CE2 of the storage capacitor Cst may be disposed on the second gate insulating layer 113. The second capacitor electrode CE2 may overlap the first gate electrode GE1 therebelow in a plan view. In this case, the first gate electrode GE1 of the driving thin-film transistor T1 and the second capacitor electrode CE2, which overlap each other with the second gate insulating layer 113 therebetween, may constitute the storage capacitor Cst. That is, the first gate electrode GE1 of the driving thin-film transistor T1 may function as the first capacitor electrode CE1 of the storage capacitor Cst, and the storage capacitor Cst may overlap the driving thin-film transistor T1. The disclosure is not limited thereto. In another embodiment, for example, the storage capacitor Cst may not overlap the driving thin-film transistor T1 in a plan view. The second capacitor electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or layers including the material described above.

The interlayer insulating layer 115 may cover the second capacitor electrode CE2. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$).

The first drain electrode DE1 and the first source electrode SE1 may be disposed on the interlayer insulating layer 115. The first drain electrode DE1 and the first source electrode SE1 may include a material having good conductivity. The first drain electrode DE1 and the first source electrode SE1 may include a conductive material including molybdenum (Mo), aluminum (Al), copper (Cu), titanium (Ti), and the like, and may include a single layer or layers including the conductive material described above. For example, the first drain electrode DE1 and the first source electrode SE1 may have a multilayer structure of Ti/Al/Ti.

The switching thin-film transistor T2 may include a second semiconductor layer Act2, a second gate electrode GE2, a second drain electrode DE2, and a second source electrode SE2. Because the second semiconductor layer Act2, the second gate electrode GE2, the second drain electrode DE2, and the second source electrode SE2 are similar to the first semiconductor layer Act1, the first gate electrode GE1, the first drain electrode DE1, and the first source electrode SE1, respectively, detailed descriptions thereof are omitted.

The pixel circuit layer PCL may further include a driving circuit DC, and the driving circuit DC may be arranged in the middle area MA. The driving circuit DC may include at least one thin-film transistor, and the driving circuit DC may be connected to a scan line. Similar to the switching thin-film transistor T2, the thin-film transistor included in the driving circuit DC may include a driving circuit semiconductor layer, a driving circuit gate electrode, a driving circuit source electrode, and a driving circuit drain electrode.

The first planarization layer 116 may cover the first drain electrode DE1 and the first source electrode SE1. The first planarization layer 116 may have a substantially flat upper surface. The first planarization layer 116 may include an organic material. In an embodiment, for example, the first planarization layer 116 may include general-purpose polymer (e.g., benzocyclobutene ("BCB"), polyimide, hexamethyldisiloxane ("HMDSO"), polymethylmethacrylate ("PMMA"), or polystyrene ("PS")), polymer derivatives having a phenolic group, acrylic polymer, imide-based polymer, aryl ether-based polymer, amide-based polymer, fluorine-based polymer, p-xylene-based polymer, vinyl alcohol-based polymer, or/or any blend thereof. The first planarization layer 116 may include an inorganic material. In this case, the first planarization layer 116 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$). When the first planarization layer 116 includes an inorganic material, chemical planarization polishing may be performed in some cases. Of course, the first planarization layer 116 may include both the organic material and the inorganic material.

The pixel circuit layer PCL may further include a connection electrode CML, and the connection electrode CML may be disposed on the first planarization layer 116. In this case, the connection electrode CML may be connected to the first drain electrode DE1 or the first source electrode SE1 through a contact hole of the first planarization layer 116.

The connection electrode CML may include a material having good conductivity. The connection electrode CML may include a conductive material including molybdenum (Mo), aluminum (Al), copper (Cu), titanium (Ti), and the like, and may include a single layer or layers including the conductive material described above. For example, the connection electrode CML may have a multilayer structure of Ti/Al/Ti.

The second planarization layer 117 may cover the connection electrode CML. The second planarization layer 117 may have a substantially flat upper surface. The second planarization layer 117 may include an organic material. In an embodiment, for example, the second planarization layer 117 may include general-purpose polymer (e.g., BCB, polyimide, HMDSO, PMMA, or PS), polymer derivatives having a phenolic group, acrylic polymer, imide-based polymer, aryl ether-based polymer, amide-based polymer, fluorine-based polymer, p-xylene-based polymer, vinyl alcohol-based polymer, or/or any blend thereof. The second planarization layer 117 may include an inorganic material. In this case, the second planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$). When the second planarization layer 117 includes an inorganic material, chemical planarization polishing may be performed in some cases. Of course, the second planarization layer 117 may include both the organic material and the inorganic material.

The display element layer DEL may be disposed on the pixel circuit layer PCL. The display element layer DEL may include a display element DPE, a pixel defining layer 119, and a spacer 121. An OLED as the display element DPE may include a pixel electrode 210, an opposite electrode 230, and an intermediate layer 220 therebetween. The intermediate layer 220 may include an emission layer.

The pixel electrode 210 may be disposed on the second planarization layer 117 having the flat upper surface. The pixel electrode 210 may be electrically connected to the connection electrode CML through a contact hole of the second planarization layer 117. As illustrated in FIG. 6, the OLED as the display element DPE may be located in the central area CA to overlap the pixel circuit PC electrically connected thereto.

The pixel electrode 210 may be a (semi)transmissive electrode or a reflective electrode. In some embodiments, the pixel electrode 210 may include a reflective layer and a transparent or semitransparent electrode layer disposed on the reflective layer. The reflective layer may include Ag, Mg, Al, Pt, Pd, Au, Ni, Nd, Ir, Cr, and any compound thereof. The transparent or semitransparent electrode layer may include at least one of indium tin oxide ("ITO"), indium zinc oxide ("IZO"), zinc oxide (ZnO or $ZnO_2$), indium oxide ($In_2O_3$), indium gallium oxide ("IGO"), and aluminum zinc oxide ("AZO"). In some embodiments, the pixel electrode 210 may have a stack structure of ITO/Ag/ITO.

The pixel defining layer 119 may be disposed on the second planarization layer 117. The pixel defining layer 119 may have an opening 119OP through which the central portion of the pixel electrode 210 is exposed, thereby defining the emission area of the pixel. Also, the pixel defining layer 119 may prevent an electric arc or the like from occurring on the edge of the pixel electrode 210 by increasing the distance between the edge of the pixel electrode 210 and the opposite electrode 230 on the pixel electrode 210. The pixel defining layer 119 may include an organic insulating material, such as polyimide, polyamide, acrylic resin, BCB, HMDSO, and phenol resin, and may be formed by spin coating.

The intermediate layer 220 may be disposed on the pixel defining layer 119. The intermediate layer 220 may include an emission layer 220b arranged in the opening of the pixel defining layer 119 and overlapping the pixel electrode 210 in a plan view. The intermediate layer 220 may further include at least one of a first functional layer 220a between the pixel electrode 210 and the emission layer 220b and a second functional layer 220c disposed on the emission layer 220b. The first functional layer 220a may include, for example, a hole transport layer ("HTL"), or may include an HTL and a hole injection layer ("HIL"). The second functional layer 220c may include an electron transport layer ("ETL") and/or an electron injection layer ("EIL"). The first functional layer 220a and/or the second functional layer 220c may be integrally formed as a single body to correspond to the pixel electrodes 210.

The opposite electrode 230 may be a transmissive electrode or a reflective electrode. In some embodiments, the opposite electrode 230 may be a transparent or semitransparent electrode, and may include a metal thin-film having a low work function and including Li, Ca, Al, Ag, Mg, or any compound thereof (for example, LiF). The opposite electrode 230 may further include, in addition to the metal thin-film, a transparent conductive oxide ("TCO") layer, such as ITO, IZO, ZnO, or $In_2O_3$. The opposite electrode 230 may be integrally formed as a single body to correspond to the pixel electrodes 210.

The spacer 121 may be disposed on the pixel defining layer 119. The spacer 121 may prevent damage to the substrate 100 and/or the multilayer layer on the substrate 100 in the method of manufacturing the display apparatus. In the method of manufacturing the display panel 10, a mask sheet may be used. At this time, the mask sheet may enter the opening 119OP of the pixel defining layer 119, or may be in close contact with the pixel defining layer 119. The spacer 121 may prevent or reduce defects in which a portion of the substrate 100 and a portion of the multilayer layer are damaged by the mask sheet when a deposition material is deposited on the substrate 100.

The spacer 121 may include an organic material, such as polyimide. Alternatively, the spacer 121 may include an inorganic insulating material, such as silicon nitride ($SiN_x$) or silicon oxide ($SiO_2$), or may include an organic insulating material and an inorganic insulating material. The spacer 121 may include a material that is different from a material of the pixel defining layer 119. Alternatively, the spacer 121 may include the same material as the same of the pixel defining layer 119. In this case, the pixel defining layer 119 and the spacers 121 may be formed together in a mask process using a halftone mask or the like.

The encapsulation layer 300 may be disposed on the opposite electrode 230. The encapsulation layer 300 may include a first inorganic encapsulation layer 310, a second inorganic encapsulation layer 320, and an organic encapsulation layer 330 therebetween.

The first inorganic encapsulation layer 310 and the second inorganic encapsulation layer 320 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$). The organic encapsulation layer 330 may include PET, polyethylene naphthalate, polycarbonate, polyimide, polyethylene sulfonate, polyoxymethylene, polyarylate, HMDSO, acrylic resin (e.g., PMMA, polyacrylic acid, etc.), or any combination thereof.

The protective layer 400 may be disposed on the encapsulation layer 300. The protective layer 400 may protect the encapsulation layer 300. For example, the protective layer 400 may prevent or reduce the occurrence of cracks in at least one of the first inorganic encapsulation layer 310 and/or the second inorganic encapsulation layer 320. A second inorganic protective layer 430 may be disposed on a first inorganic protective layer 410.

In an embodiment, the first inorganic protective layer 410 and the second inorganic protective layer 430 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$).

The touch sensor layer 500 may be disposed on the protective layer 400. The touch sensor layer 500 may be configured to obtain coordinate information according to an external input, for example, a touch event. The touch sensor layer 500 may include a first touch conductive layer 510, a first touch insulating layer 520, a second touch conductive layer 530, and a second touch insulating layer 540.

The first touch conductive layer 510 may be disposed on the second inorganic protective layer 430. The first touch conductive layer 510 may include a conductive material. Specifically, in an embodiment, the first touch conductive layer 510 may include at least one of molybdenum (Mo), aluminum (Al), copper (Cu), and titanium (Ti). For example, the first touch conductive layer 510 may have a multilayer structure of Ti/Al/Ti in which a titanium layer, an aluminum layer, and a titanium layer are sequentially stacked in this stated order.

The first touch insulating layer 520 may be disposed on the first touch conductive layer 510. The first touch insulating layer 520 may include an inorganic material. For example, the first touch insulating layer 520 may include at least one inorganic material selected from aluminum oxide ($Al_2O_3$), titanium oxide ($TiO_2$), tantalum oxide ($Ta_2O_5$), hafnium oxide ($HfO_2$), zinc oxide (ZnO), silicon oxide ($SiO_2$), silicon nitride ($SiN_x$), and oxynitride (SiON).

The second touch conductive layer 530 may be disposed on the first touch insulating layer 520. The first touch insulating layer 520 may have a contact hole, and the second touch conductive layer 530 may be connected to the first touch conductive layer 510 through the contact hole. The second touch conductive layer 530 may include a conductive material. Specifically, the second touch conductive layer 530 may include at least one of molybdenum (Mo), aluminum (Al), copper (Cu), and titanium (Ti). For example, the second touch conductive layer 530 may have a multilayer structure of Ti/Al/Ti in which a titanium layer, an aluminum layer, and a titanium layer are sequentially stacked in this stated order.

The second touch insulating layer 540 may be disposed on the second touch conductive layer 530. The second touch insulating layer 540 may have a flat upper surface. The second touch insulating layer 540 may include an organic material. Specifically, the second touch insulating layer 540 may include a polymer-based material. The polymer-based material may be transparent. For example, the second touch insulating layer 540 may include silicone-based resin, acrylic resin, epoxy-based resin, polyimide, polyethylene, or the like. In another embodiment, the second touch insulating layer 540 may include an inorganic material.

The anti-reflection layer 600 may be disposed on the touch sensor layer 500. The anti-reflection layer 600 may reduce the reflectance of light incident from the outside toward the display panel 10. The anti-reflection layer 600 may increase the color purity of light emitted from the display panel 10. The anti-reflection layer 600 may include a color filter 610, a black matrix 630, and a planarization layer 650. The color filter 610 may overlap the OLED as the display element DPE in a plan view. The color filter may be arranged considering the color of light emitted from the OLED. The color filter 610 may include a red, green, or blue pigment or dye. Alternatively, the color filter 610 may further include, in addition to the pigment or dye, quantum dots. Alternatively, the color filter 610 may not include the pigment or dye described above, and may include scattering particles, such as titanium oxide.

The black matrix 630 may be arranged adjacent to the color filter 610, and may overlap at least one of the first touch conductive layer 510 and/or the second touch conductive layer 530 in a plan view. The black matrix 630 may at least partially absorb external light or internally reflected light. The black matrix 630 may include a black pigment.

The planarization layer 650 may be disposed on the color filter 610 and the black matrix 630. The planarization layer 650 may have a flat upper surface. The planarization layer 650 may include an organic material. Specifically, the planarization layer 650 may include a transparent polymer-based material. In an embodiment, for example, the planarization layer 650 may include silicone-based resin, acrylic resin, epoxy-based resin, polyimide, polyethylene, or the like.

Figure 7:
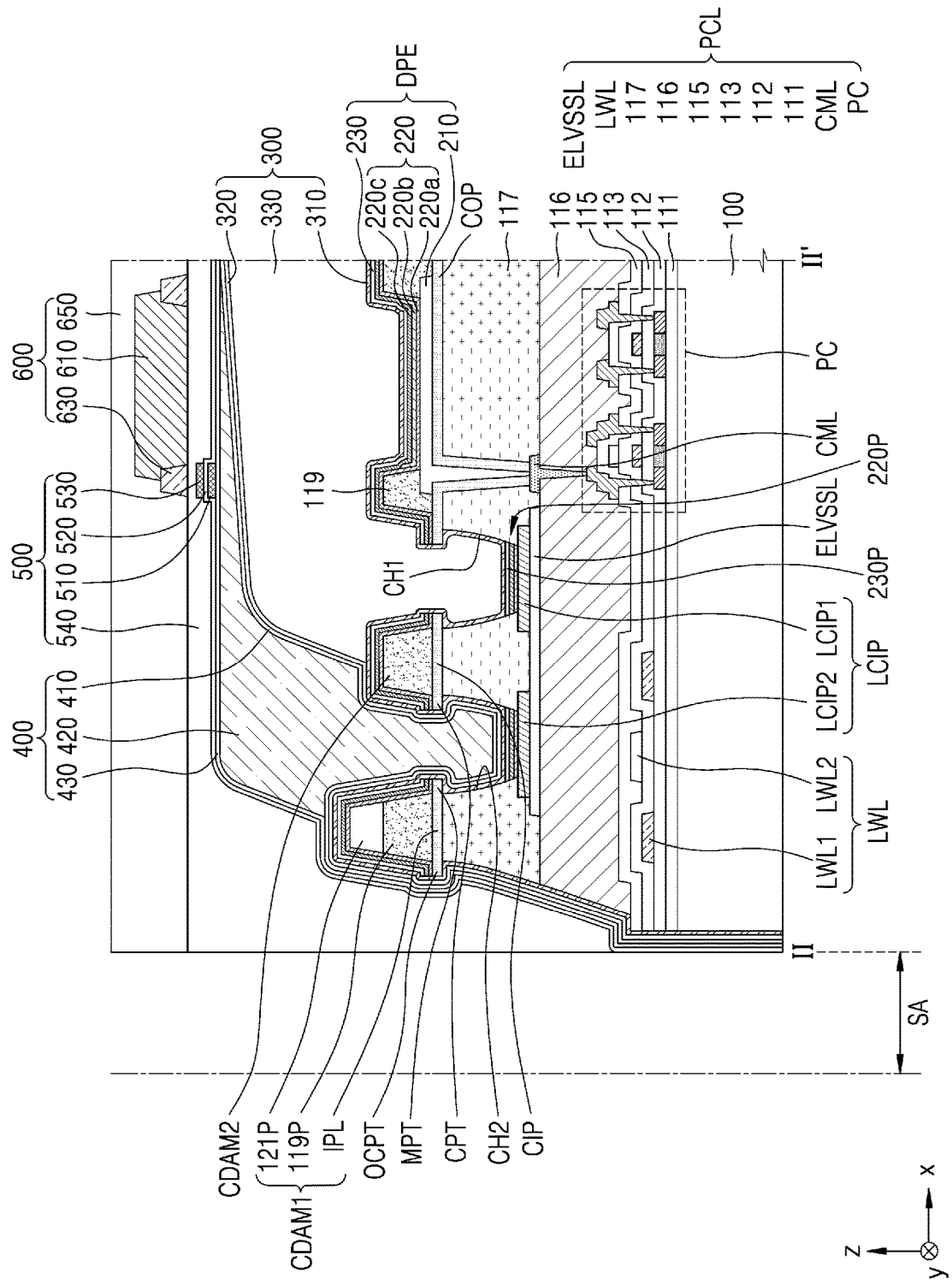
FIG. 7 is a cross-sectional view schematically illustrating a cross-section of the display apparatus taken along line II-II' of FIG. 5, according to an embodiment.

The pixel PX located in the central area CA of FIG. 5 has been described with reference to FIG. 6. Hereinafter, the structure around the separation area SA in the extension area EA and the pixel located in the extension area EA will be described with reference to FIG. 7, which is a cross-sectional view schematically illustrating the cross-section of the display apparatus 1 taken along line II-II' of FIG. 5. In FIG. 7, the same reference numbers as those illustrated in FIG. 6 denote the same or corresponding members, and thus, descriptions thereof will be omitted for convenience.

As illustrated in FIG. 7, a pixel circuit layer PCL may include a pixel circuit PC, a buffer layer 111, a first gate insulating layer 112, a second gate insulating layer 113, an interlayer insulating layer 115, a first planarization layer 116, a second planarization layer 117, and a connection electrode CML. The pixel circuit layer PCL may further include a lower wiring LWL and an electrode power supply line ELVSSL.

The lower wiring LWL may be configured to transmit a power supply voltage and/or an electrical signal to pixels arranged in a corner area CNA. The lower wiring LWL may include a first lower wiring LWL1 and a second lower wiring LWL2. The first lower wiring LWL1 may be between the first gate insulating layer 112 and the second gate insulating layer 113, and the second lower wiring LWL2 may be between the second gate insulating layer 113 and the interlayer insulating layer 115.

As in the connection electrode CML, the electrode power supply line ELVSSL may be disposed on the first planarization layer 116 and may be formed simultaneously by using the same material as the material of the connection electrode CML. The electrode power supply line ELVSSL may be electrically connected to the opposite electrode 230 included in the OLED as the display element DPE and configured to apply an electrical signal to the opposite electrode 230.

The second planarization layer 117 may cover the electrode power supply line ELVSSL and the connection electrode CML. As illustrated in FIG. 7, the second planarization layer 117 may have a first corner hole CH1 and a second corner hole CH2. Of course, the second planarization layer 117 may have a contact hole, so that the pixel electrode 210 disposed on the second planarization layer 117 is connected to the connection electrode CML through the contact hole. The first corner hole CH1, the second corner hole CH2, and the contact hole may be formed simultaneously.

The first corner hole CH1 and the second corner hole CH2 may overlap the electrode power supply line ELVSSL in a plan view. A lower corner inorganic pattern LCIP disposed on the electrode power supply line ELVSSL may prevent or minimize damage to the electrode power supply line ELVSSL in the process of forming the first corner hole CH1 and the second corner hole CH2. Specifically, the lower corner inorganic pattern LCIP includes a first lower corner inorganic pattern LCIP1 and a second lower corner inorganic pattern LCIP2. The first lower corner inorganic pattern LCIP1 may overlap the first corner hole CH1 and the second lower corner inorganic pattern LCIP2 may overlap the second corner hole CH2 in a plan view. Accordingly, in the process of forming the first corner hole CH1 and the second corner hole CH2, the electrode power supply line ELVSSL is not exposed or the degree of exposure thereof is minimized. Consequently, it is possible to prevent or minimize damage to the electrode power supply line ELVSSL. The lower corner inorganic pattern LCIP may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$).

An overlapping inorganic pattern COP, a corner inorganic pattern CIP, and an inorganic pattern line IPL may be positioned on the second planarization layer 117. The overlapping inorganic pattern COP, the corner inorganic pattern CIP, and the inorganic pattern line IPL may be formed simultaneously by using the same material as each other. The overlapping inorganic pattern COP, the corner inorganic pattern CIP, and the inorganic pattern line IPL may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$).

The overlapping inorganic pattern COP may be disposed on the second planarization layer 117 and may be located near the contact hole. Of course, as illustrated in FIG. 7, the overlapping inorganic pattern COP may also be located on the inner surface of the contact hole. In this case, the pixel electrode 210 disposed on the second planarization layer 117 may be located on the overlapping inorganic pattern COP and connected to the connection electrode CML through the contact hole.

The corner inorganic pattern CIP is spaced apart from the overlapping inorganic pattern COP by the first corner hole CH1. When seen in a plan view, the corner inorganic pattern CIP may have a shape that at least partially surrounds the overlapping inorganic pattern COP. The inorganic pattern line IPL is spaced apart from the corner inorganic pattern CIP by the second corner hole CH2. When seen in a plan view, the inorganic pattern line IPL may have a shape that at least partially surrounds the corner inorganic pattern CIP.

The corner inorganic pattern CIP may have a corner protrusion tip CPT protruding toward the center of at least one of the first corner hole CH1 and the second corner hole CH2. FIG. 7 illustrates that the corner inorganic pattern CIP protrudes toward the center of each of the first corner hole CH1 and the second corner hole CH2. The inorganic pattern line IPL may have a middle protrusion tip MPT protruding toward the center of the second corner hole CH2. Also, the inorganic pattern line IPL may have an outer corner protrusion tip OCPT protruding toward the separation area SA. Of course, as illustrated in FIG. 7, the overlapping inorganic pattern COP may also have a protrusion tip protruding toward the center of the first corner hole CH1.

The pixel defining layer 119 may cover the edge of the pixel electrode 210. In this case, when the pixel defining layer 119 is formed, a first pattern 119P may be formed simultaneously by using the same material as each other. The first pattern 119P may be disposed on the inorganic pattern line IPL. The first pattern 119P may form a first corner dam CDAM1 together with the inorganic pattern line IPL. Of course, when a spacer 121 is formed on the pixel defining layer 119, a second pattern 121P may be formed simultaneously on the first pattern 119P by using the same material as each other. In this case, the first pattern 119P and the second pattern 121P may form the first corner dam CDAM1 together with the inorganic pattern line IPL. Also, when the pixel defining layer 119 is formed, a second corner dam CDAM2 may be formed simultaneously by using the same material as each other. The second corner dam CDAM2 is spaced apart from the first corner dam CDAM1 and located on the corner inorganic pattern CIP.

As in the central area CA described above with reference to FIG. 6, the intermediate layer 220 may be disposed on the pixel defining layer 119 even in the extension area EA. The intermediate layer 220 may include an emission layer 220b arranged in the opening of the pixel defining layer 119 and overlapping the pixel electrode 210 in a plan view. The intermediate layer 220 may further include at least one of a first functional layer 220a between the pixel electrode 210 and the emission layer 220b and a second functional layer 220c disposed on the emission layer 220b.

As described above, the overlapping inorganic pattern COP may also have a protrusion tip protruding toward the center of the first corner hole CH1. The corner inorganic pattern CIP may have a corner protrusion tip CPT protruding toward the center of the first corner hole CH1. Accordingly, when the first functional layer 220a and the second functional layer 220c are formed, a functional layer pattern 220P may be formed. The functional layer pattern 220P may be separated from the first functional layer 220a and the second functional layer 220c by the protrusion tip of the overlapping inorganic pattern COP and the corner protrusion tip CPT of the corner inorganic pattern CIP and may be located in the first corner hole CH1. Also, as described above, the inorganic pattern line IPL has a middle protrusion tip MPT protruding toward the center of the second corner hole CH2. Accordingly, when the first functional layer 220a and the second functional layer 220c are formed, the functional layer pattern 220P located in the second corner hole CH2 may be formed by the corner protrusion tip CPT and the middle protrusion tip MPT.

The opposite electrode 230 is formed on the pixel defining layer 119 and the intermediate layer 220 to correspond to the pixel electrodes 210. Accordingly, for the same reason as the formation of the functional layer pattern 220P located in the first corner hole CH1 and the second corner hole CH2, a common electrode pattern 230P may be formed in the first corner hole CH1 and the second corner hole CH2.

The first inorganic encapsulation layer 310 included in the encapsulation layer 300 may be disposed on the opposite electrode 230, and may be in direct contact with the protrusion tip of the overlapping inorganic pattern COP, the corner protrusion tip CPT of the corner inorganic pattern CIP. and the middle protrusion tip MPT of the inorganic pattern line IPL. Furthermore, in some cases, as illustrated in FIG. 7, the first inorganic encapsulation layer 310 may be in contact with the common electrode pattern 230P in the first corner hole CH1 and the second corner hole CH2, and may cover the inner surfaces of the first corner hole CH1 and the second corner hole CH2. The organic encapsulation layer 330 included in the encapsulation layer 300 may be disposed on the first inorganic encapsulation layer 310. As illustrated in FIG. 7, the organic encapsulation layer 330 may fill the first corner hole CH1. The second corner dam CDAM2 may prevent a material for forming the organic encapsulation layer 330 from flowing out to the outside during the manufacturing process. The second inorganic encapsulation layer 320 included in the encapsulation layer 300 may be disposed on the organic encapsulation layer 330. The second inorganic encapsulation layer 320 may be in direct contact with the first inorganic encapsulation layer 310 on the second corner dam CDAM2. The second inorganic encapsulation layer 320 may be in direct contact with the first inorganic encapsulation layer 310 even in the second corner hole CH2.

The protective layer 400 may include a first inorganic protective layer 410, an organic protective layer 420, and a second inorganic protective layer 430. The first inorganic protective layer 410 may be disposed on the encapsulation layer 300, and the organic protective layer 420 may be disposed on the first inorganic protective layer 410. The second inorganic protective layer 430 may be disposed on the organic protective layer 420. The organic protective layer 420 may fill the second corner hole CH2. The second inorganic protective layer 430 may be in direct contact with the first inorganic protective layer 410 on the first corner dam CDAM1. The first inorganic protective layer 410 and the second inorganic protective layer 430 may surround the corner protrusion tip CPT of the corner inorganic pattern CIP. The first inorganic protective layer 410 and the second inorganic protective layer 430 may surround the outer corner protrusion tip OCPT of the inorganic pattern line IPL. This may effectively prevent the display apparatus from being damaged by external oxygen or moisture, and may prevent the display apparatus from being damaged due to external impact by increase the mechanical strength of the display apparatus.

A touch sensor layer 500 may be disposed on the protective layer 400. The touch sensor layer 500 may include a first touch conductive layer 510, a first touch insulating layer 520, a second touch conductive layer 530, and a second touch insulating layer 540. The second touch insulating layer 540 may overlap the outer corner protrusion tip OCPT of the inorganic pattern line IPL in a plan view.

As in the central area CA described above with reference to FIG. 6, an anti-reflection layer 600 may be disposed on the touch sensor layer 500 even in the extension area EA. The anti-reflection layer 600 may include, for example, a color filter 610, a black matrix 630, and a planarization layer 650. The color filter 610 may overlap the pixel electrode 210.

Figure 8:
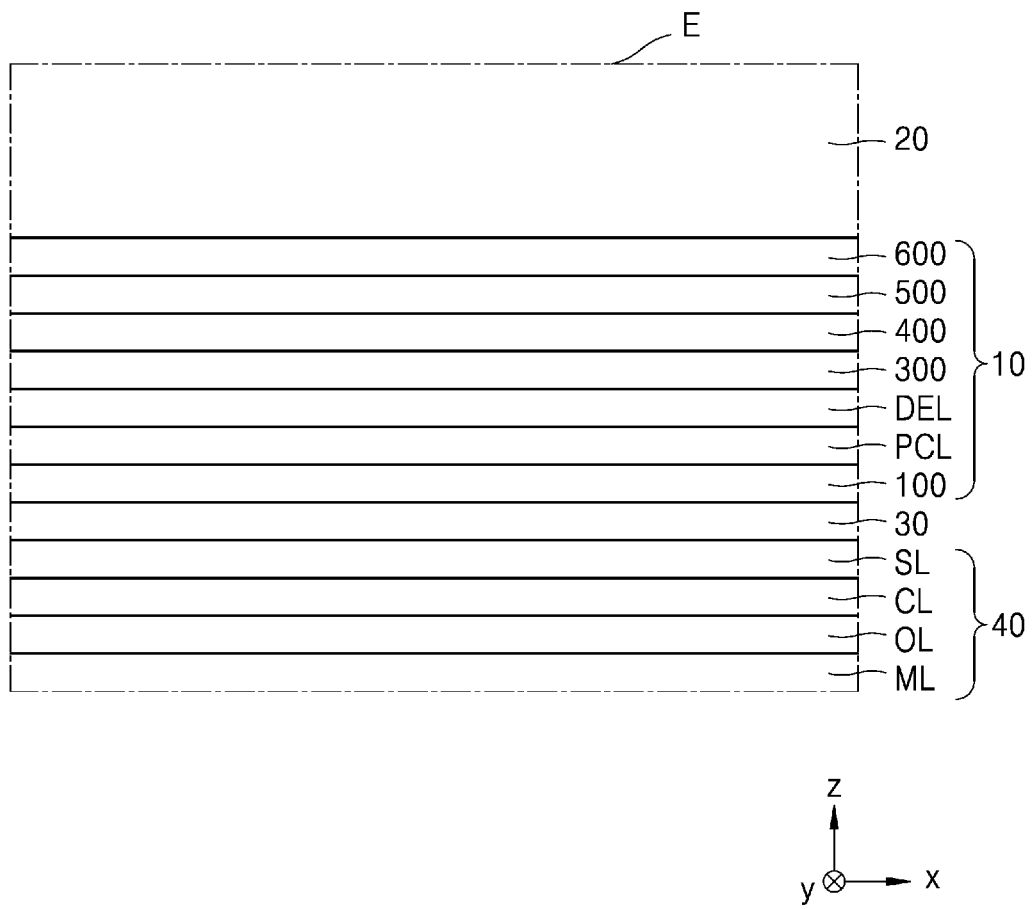
FIG. 8 is an enlarged conceptual diagram of portion E of FIG. 2A, according to an embodiment.

FIG. 8 is a plan view schematically illustrating a portion of the display apparatus 1 according to an embodiment. Specifically, FIG. 8 is an enlarged cross-sectional view of portion E of FIG. 2A, according to an embodiment. As illustrated in FIG. 8, the cover panel 40 may include a metal layer ML, an organic layer OL, a cushion layer CL, and a silicon layer SL.

Among the metal layer ML, the organic layer OL, the cushion layer CL, and the silicon layer SL, the metal layer ML may be disposed farthest from the display panel 10. The metal layer ML may shield electromagnetic interference ("EMI") and/or dissipate heat. The metal layer ML may include a heat dissipation member configured to efficiently dissipate heat. In an embodiment, for example, the metal layer ML may include a metal material having high thermal conductivity, such as copper, nickel, ferrite, silver, or aluminum.

The organic layer OL may be disposed on the metal layer ML. The organic layer OL may include a synthetic resin film. Specifically, the organic layer OL may include a thermosetting resin. In an embodiment, for example, the organic layer OL may include at least one of polyimide-based resin, acrylic resin, methacrylic resin, polyisoprene, vinyl-based resin, epoxy-based resin, urethane-based resin, cellulose-based resin, siloxane-based resin, polyamide-based resin, and perylene-based resin.

Although not illustrated, an adhesive layer may be between the metal layer ML and the organic layer OL. For example, the adhesive layer between the metal layer ML and organic layer OL may include at least one of an OCR, an OCA, and a PSA.

The cushion layer CL may be disposed on the organic layer OL. The cushion layer CL may be a synthetic resin foam including a matrix member and a plurality of voids. The matrix member may include a flexible material. For example, the matrix member may include a synthetic resin. The voids may easily absorb impact applied to the display panel 10. The voids may be defined as the cushion layer CL has a porous structure. Therefore, the voids may be dispersed in the matrix member. The voids may allow the cushion layer CL to be easily deformed. Accordingly, the elasticity of the cushion layer CL may be improved to enhance the impact resistance of the cover panel 40.

The cushion layer CL may include a light blocking material. Accordingly, the cushion layer CL may block external light from being incident toward the display panel 10. The light blocking material may include at least one of a black dye and black particles. In an embodiment, for example, the light blocking material may include Cr, $CrO_x$, $Cr/CrO_x$, $Cr/CrO_x/CrN_y$, resin (carbon pigment or RGB mixed pigment), graphite, non-Cr-based material, lactam-based pigment, or perylene-based pigment. The light blocking material may include a black organic pigment, and the black organic pigment may include at least one selected from aniline black, lactam black, and perylene black.

The silicon layer SL may be disposed on the cushion layer CL. Specifically, the silicon layer SL may be between the cushion layer CL and the protective film 30. The silicon layer SL may include a second silicon-based compound. The second silicon-based compound may include a silicon-containing organosilicon compound. Specifically, the second silicon-based compound may include a siloxane-based material.

In an embodiment, the second silicon-based compound included in the silicon layer SL may include the same material as the first silicon-based compound included in the protective film 30. For example, the first silicon-based compound and the second silicon-based compound may include polydimethylsiloxane. Because the protective film 30 and the silicon layer SL include the same material as each other, the protective film 30 and the silicon layer SL may have the same or similar properties. Accordingly, adhesion between the protective film 30 and the silicon layer SL may be improved. However, the disclosure is not limited thereto.

In another embodiment, the second silicon-based compound included in the silicon layer SL may be different from the first silicon-based compound included in the protective film 30. In an embodiment, for example, the first silicon-based compound may include polydimethylsiloxane, and the second silicon-based compound may include at least one of silica and silsesquioxane. In this case as well, silica and silsesquioxane may include a siloxane group. That is, polydimethylsiloxane, silica, and silsesquioxane may include the same element as each other and may include the same functional group as each other. Accordingly, the protective film 30 and the silicon layer SL may have the same or similar properties, and adhesion between the protective film 30 and the silicon layer SL may be improved. The second silicon-based compound may be in the form of fine particles. The particle diameter of the second silicon-based compound may be several tens of nanometers (nm) to several hundreds of nm.

Figure 9A:
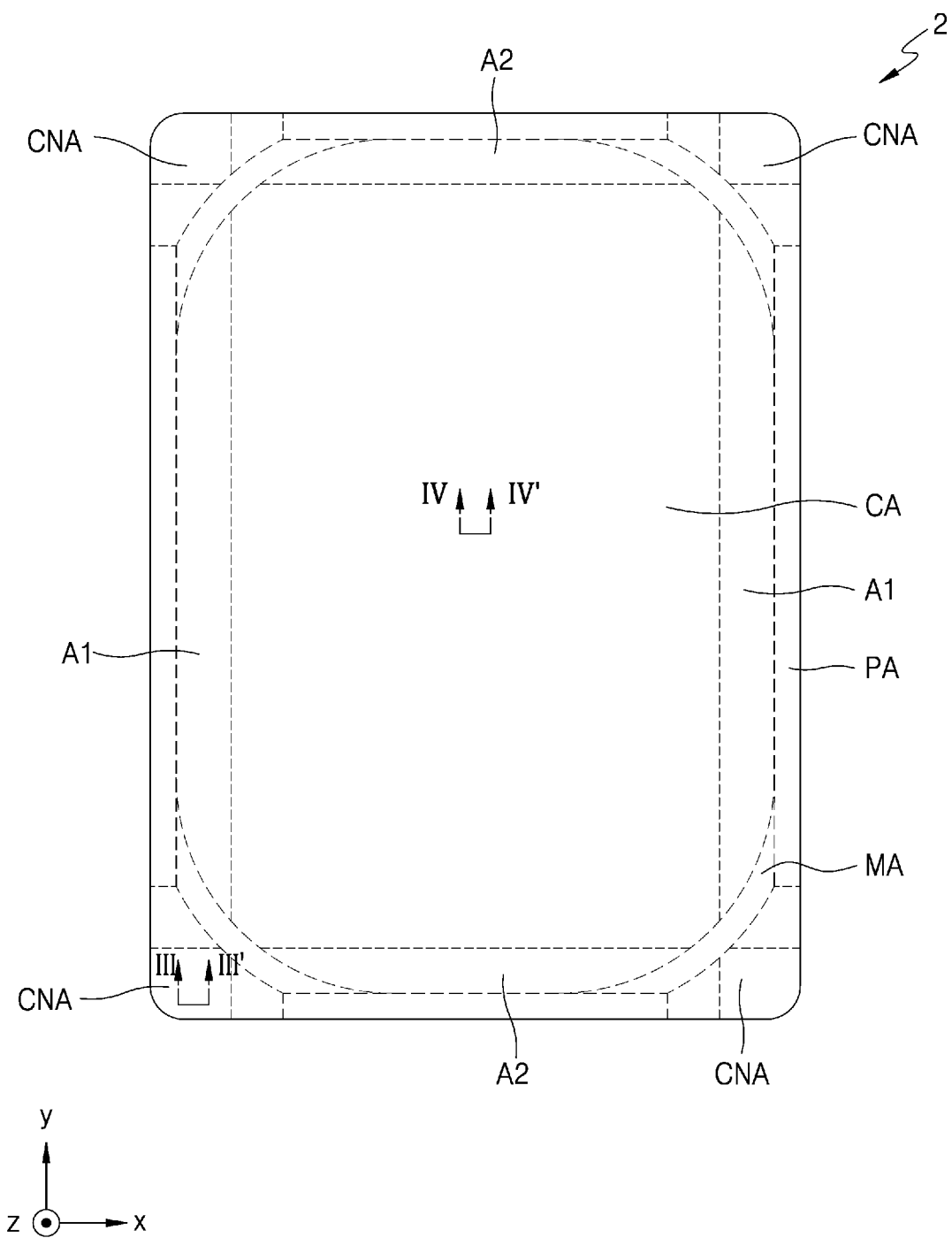
FIG. 9A is a plan view schematically illustrating a portion of a display apparatus according to another embodiment.
Figure 9B:
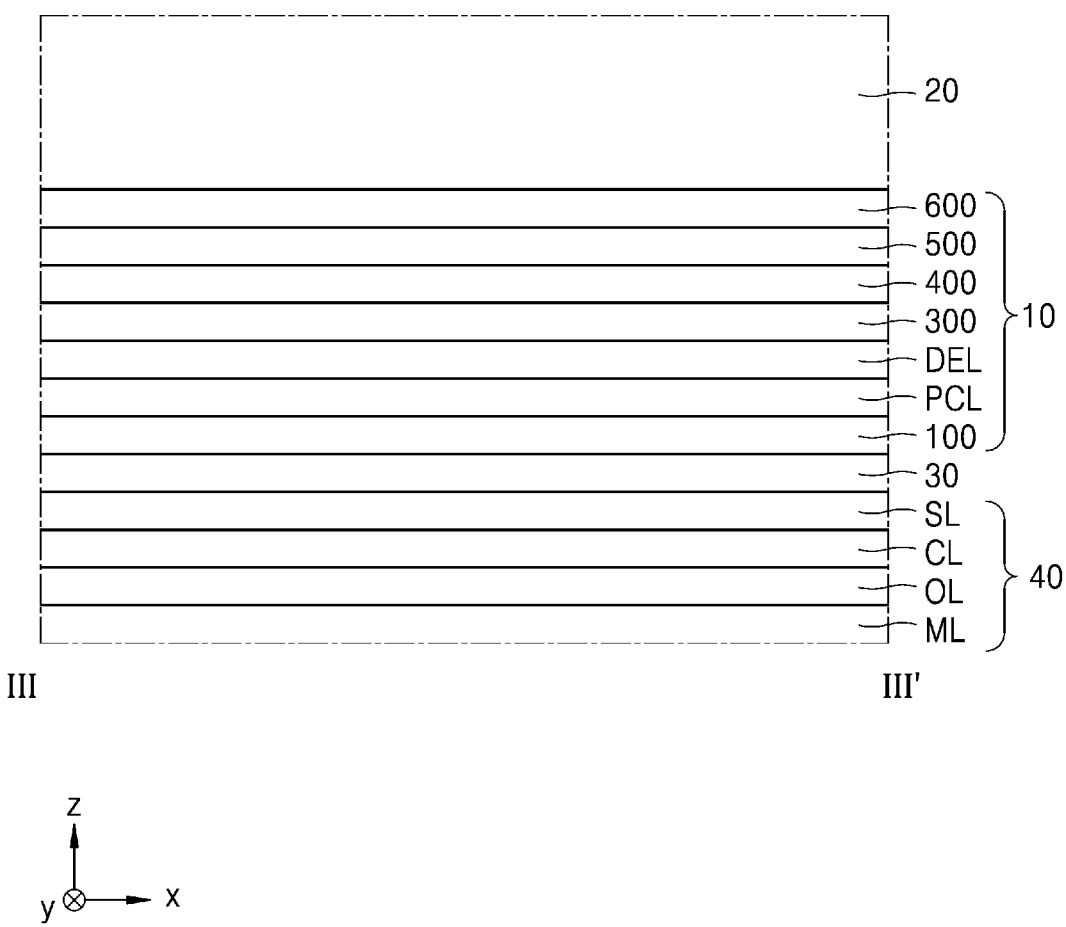
FIG. 9B is a cross-sectional view schematically illustrating a cross-section of the display apparatus taken along line III-III' of FIG. 9A, according to an embodiment.
Figure 9C:
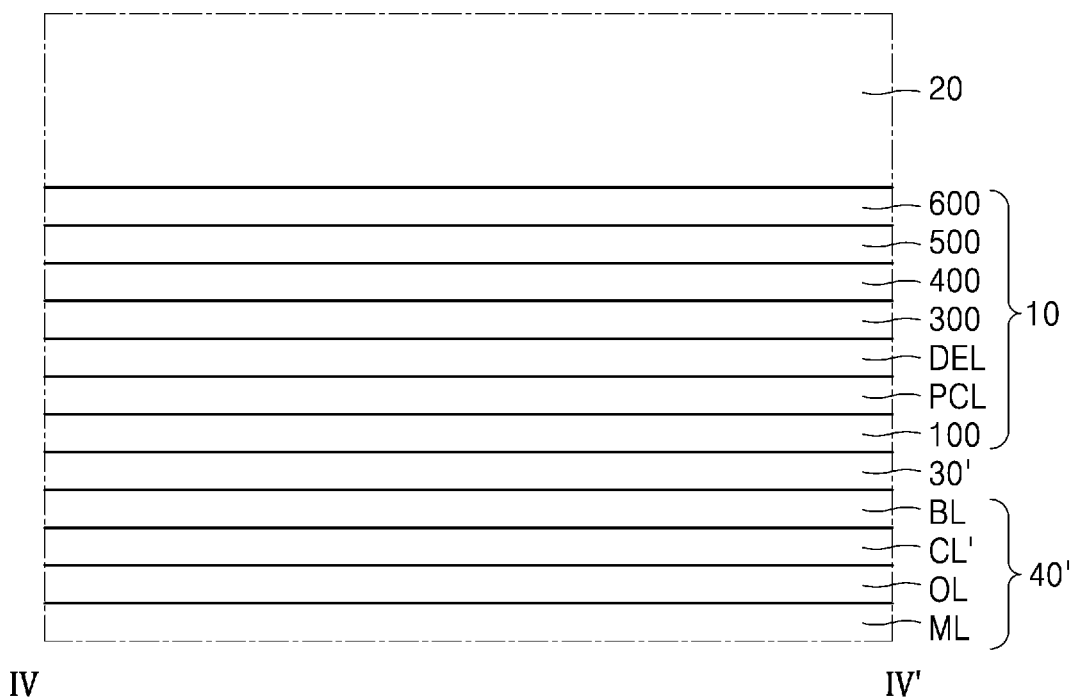
FIG. 9C is a cross-sectional view schematically illustrating a cross-section of the display apparatus taken along line IV-IV' of FIG. 9A, according to an embodiment.

FIG. 9A is a plan view schematically illustrating a portion of a display apparatus 2 according to another embodiment, FIG. 9B is a cross-sectional view schematically illustrating a cross-section of the display apparatus 2 taken along line III-III' of FIG. 9A, according to an embodiment, and FIG. 9C is a cross-sectional view schematically illustrating a cross-section of the display apparatus 2 taken along line IV-IV' of FIG. 9A, according to an embodiment. Because the display apparatus 2 according to the present embodiment is similar to the display apparatus 1 described above with reference to FIGS. 1A to 8, differences from the display apparatus 1 described above with reference to FIGS. 1A to 8 will be mainly described. In FIGS. 9A to 9C, the same reference numerals as those in FIGS. 1A to 8 denote the same members, and redundant descriptions thereof are omitted.

In the display apparatus 1 described above with reference to FIG. 8 and the like, the protective film 30 and the cover panel 40 may be disposed under the display panel 10 in the central area CA, the first area A1, the second area A2, the middle area MA, the peripheral area PA, and the corner area CNA of the display apparatus 1. As illustrated in FIG. 9B, even in the display apparatus 2 according to the present embodiment, a protective film 30 and a cover panel 40 may be arranged in a corner area CNA of the display apparatus 2.

However, as illustrated in FIG. 9C, in the display apparatus 2 according to the present embodiment, the structures and/or constituent materials of the protective film 30 and the cover panel 40 disposed under the display panel 10 may be different depending on the positions thereof in the display apparatus 2. Specifically, a protective film 30' and a cover panel 40' may be disposed under the display panel 10 in areas of the display apparatus 2 other than the corner area CNA of the display apparatus 2 (for example, in the central area CA, the first area A1, the second area A2, the middle area MA, and the peripheral area PA).

The protective film 30' may be disposed under the display panel 10 to face the lower surface (the −z direction) of the display panel 10. Specifically, the protective film 30' may be disposed under areas other than the corner area CNA of the display panel 10. Compared with the protective film 30 of the display apparatus 1 described above, the protective film 30' according to the present embodiment may not include the first silicon-based compound. Specifically, the protective film 30' does not include the first silicon-based compound, but may include PET.

The cover panel 40' may include a metal layer ML and an organic layer OL. Compared with the cover panel 40 of the display apparatus 1 described above, the cover panel 40' according to the present embodiment may include a cushion layer CL' and a light blocking layer BL. The cushion layer CL' may be disposed on the organic layer OL, and the light blocking layer BL may be disposed on the cushion layer CL'. That is, compared with the cushion layer CL of the cover panel 40 of the display apparatus 1, the cushion layer CL' may not include a light blocking material, and the cover panel 40' may include a light blocking layer BL that is a separate layer independent from the cushion layer CL'.

The light blocking layer BL may include a light blocking material. Accordingly, the light blocking layer BL may block external light from being incident toward the display panel 10. The light blocking material may include at least one of a black dye and black particles. For example, the light blocking material may include Cr, $CrO_x$, $Cr/CrO_x$, $Cr/CrO_x/CrN_y$, resin (carbon pigment or RGB mixed pigment), graphite, non-Cr-based material, lactam-based pigment, or perylene-based pigment. The light blocking material may include a black organic pigment, and the black organic pigment may include at least one selected from aniline black, lactam black, and perylene black.

Although not illustrated in FIG. 9C, an adhesive layer may be between the light blocking layer BL and the protective film 30'. Due to the adhesive layer, the cover panel 40' including the light blocking layer BL may be bonded under the protective film 30'. The adhesive layer between the light blocking layer BL and the protective film 30' may include at least one of an OCR, an OCA, and a PSA.

The display apparatus 1 has been described above, but the disclosure is not limited thereto. It will be stated that a method of manufacturing a display apparatus also falls within the scope of the disclosure. Hereinafter, a method of manufacturing a display apparatus will be described. FIGS. 10A to 10E are cross-sectional views for describing a process of preparing a preliminary cover panel P40 in a method of manufacturing a display apparatus, according to an embodiment.

Figure 10A:
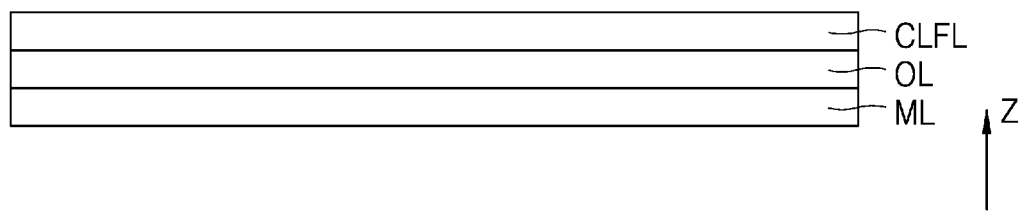
FIGS. 10A to 10E are cross-sectional views for describing a process of preparing a preliminary cover panel in a method of manufacturing a display apparatus, according to an embodiment.

As illustrated in FIG. 10A, a cushion-layer-forming layer CLFL may be formed on an organic layer OL. As used herein, the term "cushion-layer-forming layer" may refer to a layer that is heat-treated after a cushion layer composition is applied thereonto. A metal layer ML may be disposed under the organic layer OL. That is, after the metal layer ML is bonded to the lower surface (the −z direction) of the organic layer OL, the cushion-layer-forming layer CLFL may be formed on the surface (i.e., upper surface) opposite to one surface of the organic layer OL to which the metal layer ML is bonded. An adhesive layer may be used to bond the metal layer ML under the organic layer OL. For example, the adhesive layer may include at least one of an OCR, an OCA, and a PSA.

The cushion layer composition may include at least one of a urethane-based compound and an epoxy-based compound. For example, the cushion layer composition may include at least one of polyurethane-based resin and polyepoxy-based resin.

The cushion layer composition may further include a thermal curing agent and a photo-curing agent. The thermal curing agent may be included as long as the thermal curing agent is used to thermally cure the urethane-based compound and/or the epoxy-based compound, and is not particularly limited. In an embodiment, for example, the thermal curing agent may include at least one of diethylenetriamine, phthalic anhydride, trioxane tritylene mercaptan, and 2-methylimidazole. The photo-curing agent may be included as long as the photo-curing agent is used to photo-cure the urethane-based compound and/or the epoxy-based compound, and may not be particularly limited. Also, the cushion layer composition may further include a solvent. The solvent included in the cushion layer composition may be a water-soluble solvent. That is, the cushion layer composition may be a solution in which at least one of a urethane-based compound and an epoxy-based compound, a photo-curing agent, and a thermal curing agent are dissolved in a solvent.

The cushion layer composition may be applied onto the organic layer OL. The cushion layer composition may be applied onto the organic layer OL by using various methods. For example, the cushion layer composition may be applied onto the entire surface of the organic layer OL by using an inkjet device. Alternatively, the cushion layer composition may be coated on the organic layer OL by dip coating.

The cushion-layer-forming layer CLFL may be formed on the organic layer OL by removing at least a portion of the solvent through heat treatment on the applied cushion layer composition. That is, the cushion-layer-forming layer CLFL may include at least one of a urethane-based compound and an epoxy-based compound, a photo-curing agent, and a thermal curing agent. The heat treatment may be performed at a temperature of 80 degrees in Celsius (° C.) to 120° C. for several seconds to several tens of seconds. Because the cushion layer composition is heat-treated for only a few seconds to several tens of seconds, sufficient energy to thermally cure the cushion layer composition may not be supplied to the cushion layer composition. Accordingly, in the forming of the cushion-layer-forming layer CLFL, the cushion layer composition may not be thermally cured.

Figure 10B:
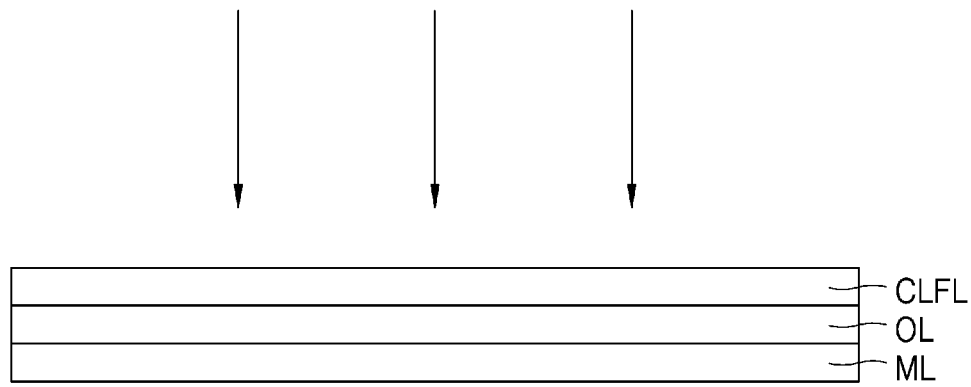

As illustrated in FIG. 10B, the cushion-layer-forming layer CLFL may be irradiated with ultraviolet light. Due to this, a preliminary cushion layer PCSL of FIG. 10C may be formed. As used herein, the term "preliminary cushion layer" may refer to a layer that is photo-cured by irradiating the cushion-layer-forming layer CLFL with ultraviolet light. Specifically, the cushion-layer-forming layer CLFL may be irradiated with ultraviolet light having a light intensity of 100 millijoules per square centimeters (mJ/cm$^2$) to 1,000 mJ/cm$^2$. Ultraviolet light having a wavelength of about 300 nm to about 400 nm may be used for photo-curing. An LED or a metal halide may be used as an ultraviolet source.

The cushion-layer-forming layer CLFL may be photo-cured by irradiating the cushion-layer-forming layer CLFL with ultraviolet light. Accordingly, the viscosity and/or hardness of the preliminary cushion layer PCSL may be greater than the viscosity and/or hardness of the cushion-layer-forming layer CLFL, and the preliminary cushion layer PCSL may maintain a constant shape. As will be described below, a silicon layer composition may be applied onto the preliminary cushion layer PCSL. Because the preliminary cushion layer PCSL maintains a constant shape, the silicon layer composition may be easily applied onto the preliminary cushion layer PCSL. The cushion-layer-forming layer CLFL may be photo-cured to the extent that the preliminary cushion layer PCSL maintains a constant shape so as to perform a subsequent process. As the cushion-layer-forming layer CLFL is irradiated with ultraviolet light, a plurality of voids may be formed in the cushion-layer-forming layer CLFL. That is, the preliminary cushion layer PCSL may be a foam layer including a matrix member and a plurality of voids.

Figure 10C:
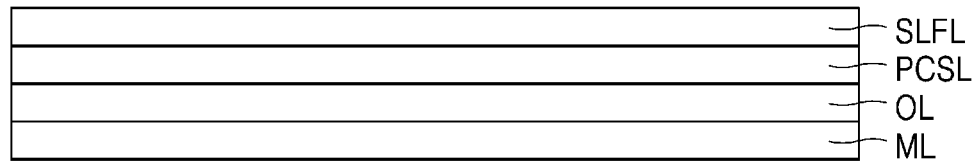

As illustrated in FIG. 10C, a silicon-layer-forming layer SLFL may be formed on the preliminary cushion layer PCSL. As used herein, the term "silicon-layer-forming layer" may refer to a layer that is heat-treated after a silicon layer composition is applied thereonto. Specifically, the silicon layer composition may include a second silicon-based compound. The second silicon-based compound may include a silicon-containing organosilicon compound. Specifically, the second silicon-based compound may include a siloxane-based material. For example, the second silicon-based compound may include at least one of polydimethylsiloxane, silica, and silsesquioxane. The second silicon-based compound may be included in the silicon layer composition in the form of fine particles. The particle diameter of the second silicon-based compound may be several tens of nanometers (nm) to several hundreds of nm.

The silicon layer composition may further include an acrylic compound. For example, the acrylic compound may be acrylic resin. The acrylic compounds may include at least one of methyl methacrylate, acrylic acid, ethylhexyl acrylate, pentafluoropropyl acrylate, and ethylene glycol dimethacrylate.

The silicon layer composition may further include a thermal curing agent and a photo-curing agent. The thermal curing agent may be included as long as the thermal curing agent is used to thermally cure the acrylic compound, and may not be particularly limited. The photo-curing agent may be included as long as the photo-curing agent is used to photo-cure the acrylic compound, and may not be particularly limited. Also, the silicon layer composition may further include a solvent. The solvent included in the silicon layer composition may be a water-soluble solvent. That is, the silicon layer composition may be a solution in which a second silicon-based compound, an acrylic compound, a photo-curing agent, and a thermal curing agent are dissolved in a solvent.

The silicon layer composition may be applied onto the preliminary cushion layer PCSL. The silicon layer composition may be applied onto the preliminary cushion layer PCSL by using various methods. For example, the silicon layer composition may be applied onto the entire surface of the preliminary cushion layer PCSL by using an inkjet device. Alternatively, the silicon layer composition may be coated on the preliminary cushion layer PCSL by dip coating. The silicon-layer-forming layer SLFL may be formed on the preliminary cushion layer PCSL by removing at least a portion of the solvent through heat treatment on the applied silicon layer composition. That is, the silicon-layer-forming layer SLFL may include a second silicon-based compound, an acrylic compound, a photo-curing agent, and a thermal curing agent. The heat treatment may be performed at a temperature of 80° C. to 120° C. for several seconds to several tens of seconds. Because the silicon layer composition is heat-treated for only a few seconds to several tens of seconds, sufficient energy to thermally cure the silicon layer composition may not be supplied to the silicon layer composition. Accordingly, in the forming of the silicon-layer-forming layer SLFL, the silicon layer composition may not be thermally cured.

Figure 10D:
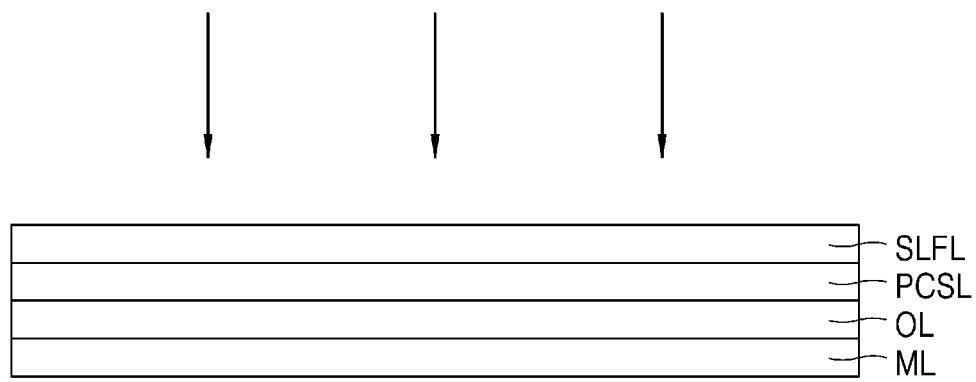
Figure 10E:
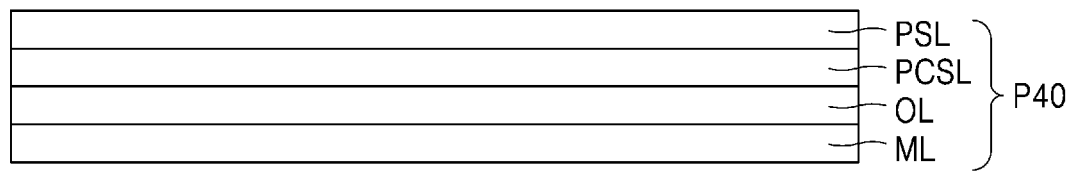

As illustrated in FIG. 10D, the silicon-layer-forming layer SLFL may be irradiated with ultraviolet light. Due to this, a preliminary silicon layer PSL of FIG. 10E may be formed. That is, a preliminary cover panel P40 of FIG. 10E including the preliminary silicon layer PSL may be formed. As used herein, the term "preliminary silicon layer" may refer to a layer that is photo-cured by irradiating the silicon-layer-forming layer SLFL with ultraviolet light. Specifically, the silicon-layer-forming layer SLFL may be irradiated with ultraviolet light having a light intensity of 100 mJ/cm$^2$ to 1,000 mJ/cm$^2$. Ultraviolet light having a wavelength of about 300 nm to about 400 nm may be used for photo-curing. An LED or a metal halide may be used as an ultraviolet source.

The silicon-layer-forming layer SLFL may be photo-cured by irradiating the silicon-layer-forming layer SLFL with ultraviolet light. Accordingly, the viscosity and/or hardness of the preliminary silicon layer PSL may be greater than the viscosity and/or hardness of the silicon-layer-forming layer SLFL, and the preliminary silicon layer PSL may maintain a constant shape. The silicon-layer-forming layer SLFL may be photo-cured to the extent that the preliminary silicon layer PSL maintains a constant shape so as to perform a subsequent process.

In the process of preparing the preliminary cover panel P40, areas of the preliminary cover panel P40 corresponding to the first area A1, the second area A2, the middle area MA, the peripheral area PA, and the corner area CNA of the display panel 10 may be flat without being bent.

Figure 11:
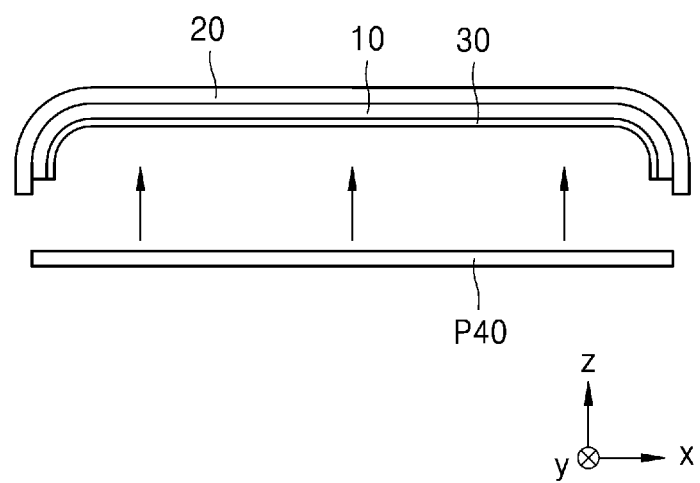
FIG. 11 is a cross-sectional view for describing a process of bonding the preliminary cover panel in the method of manufacturing a display apparatus, according to an embodiment.

FIG. 11 is a schematic cross-sectional view for describing a process of bonding the preliminary cover panel P40 under the display panel 10 in the method of manufacturing a display apparatus, according to an embodiment. The display panel 10 may be disposed such that the lower surface (the −z direction) of the display panel 10 faces the preliminary cover panel P40. That is, the display panel 10 may be disposed such that the lower surface (the −z direction) of the protective film 30 bonded under the display panel 10 faces the preliminary cover panel P40.

The first area A1, the second area A2, the middle area MA, the peripheral area PA, and the corner area CNA of the display panel 10 may be in a bent state. That is, the display panel 10 may be preformed before the preliminary cover panel P40 is bonded under the display panel 10. For example, the display panel 10, which is in an unbent state, that is, in a flat state, may be preformed by using a guide film (not illustrated). Specifically, after the display panel 10 in a flat state is bonded to the guide film, the shape of the display panel 10 may be deformed by applying external force, for example, tensile force, to the guide film. Because the guide film is commonly used in the preforming of the display panel, a detailed description thereof is omitted.

In the cover window 20 and the protective film 30 bonded to the display panel 10, areas corresponding to the first area A1, the second area A2, the middle area MA, the peripheral area PA, and the corner area CNA of display panel 10 may be in a bent state. For example, after the cover window 20 in a flat state is preformed to correspond to the shape of the preformed display panel 10, the preformed cover window 20 may be bonded to the upper surface (the +z direction) of the preformed display panel 10. After the protective film 30 in a flat state is preformed to correspond to the shape of the preformed display panel 10, the preformed protective film 30 may be bonded to the lower surface (the −z direction) of the preformed display panel 10. However, the disclosure is not limited thereto. In another embodiment, for example, the cover window 20 in a flat state may be bonded to the upper surface (the +z direction) of the display panel 10 in an unbent state, that is, in a flat state, and the protective film 30 in a flat state may be bonded to the lower surface (the −z direction) of the display panel 10. A combination of the display panel 10, the cover window 20, and the protective film 30 may be preformed simultaneously by using the guide film.

Areas of the preliminary cover panel P40 corresponding to the first area A1, the second area A2, the middle area MA, the peripheral area PA, and the corner area CNA of the display panel 10 may be flat without being bent. The preliminary cover panel P40 in a flat state may be directly bonded to the lower surface (the −z direction) of the protective film 30, without being preformed. As described above, the silicon-layer-forming layer SLFL may be photo-cured only to the extent that the preliminary silicon layer PSL maintains a constant shape. Accordingly, because the preliminary silicon layer PSL is flabby, the preliminary silicon layer PSL may be easily deformed. Accordingly, the preliminary silicon layer PSL may be uniformly bonded to the bent protective film 30 without a phenomenon in which a portion of the preliminary silicon layer PSL overlaps another portion or is lifted. In this case, because the preliminary silicon layer PSL is not thermally cured, the preliminary silicon layer PSL may have viscosity and may be sticky. Accordingly, even when a separate adhesive layer is not between the preliminary silicon layer PSL and the protective film 30, the preliminary silicon layer PSL may be bonded to the protective film 30.

Figure 12:
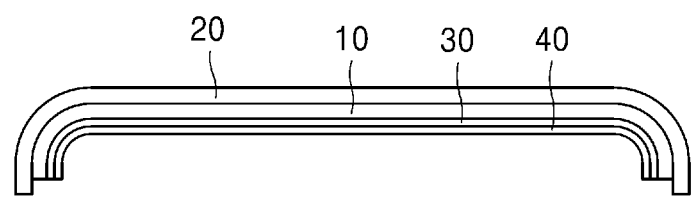
FIG. 12 is a cross-sectional view for describing a process of thermally coring the preliminary cover panel in the method of manufacturing a display apparatus, according to an embodiment.
Figure 12:
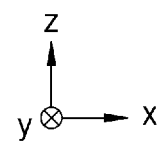

As illustrated in FIG. 12, the cover panel 40 may be formed by thermally curing the preliminary cover panel P40. Specifically, the cushion layer CL and the silicon layer SL may be formed by thermally curing the preliminary cushion layer PCSL and the preliminary silicon layer PSL, which are included in the preliminary cover panel P40. The temperature at which the preliminary cover panel P40 is thermally cured may be lower than the temperature at which the cushion layer composition or the silicon layer composition is heat-treated, and the time taken to thermally cure the preliminary cover panel P40 may be longer than the time taken to heat-treat the cushion layer composition or the silicon layer composition. In an embodiment, for example, the thermal curing may be performed at a temperature of 50° C. to 80° C. for about 5 minutes to about 30 minutes. Accordingly, the hardness of the cushion layer CL may be greater than the hardness of the preliminary cushion layer PCSL, and the hardness of the silicon layer SL may be greater than the hardness of the preliminary silicon layer PSL.

The thermal curing may improve adhesion between the silicon layer SL and the protective film 30. That is, adhesion between the silicon layer SL and the protective film 30 may be greater than adhesion between the preliminary silicon layer PSL and the protective film 30. Thermal energy may be supplied to the cover window 20, the display panel 10, the protective film 30, and the preliminary cover panel P40 for thermal curing. Accordingly, a chemical bond may be formed between the first silicon-based compound included in the protective film 30 and the second silicon-based compound included in the preliminary silicon layer PSL. For example, a bond may be formed between a sulfur (S) atom included in the first silicon-based compound and an oxygen (O) atom included in the second silicon-based compound, or a bond may be formed between a sulfur (S) atom included in the second silicon-based compound and an oxygen (O) atom included in the first silicon-based compound. Therefore, adhesion between the silicon layer SL and the protective film 30 may be greater than adhesion between the preliminary silicon layer PSL and the protective film 30. That is, adhesion between the cover panel 40 and the protective film 30 may be improved.

Even when compared with a case where the silicon layer SL does not include the second silicon-based compound, adhesion between the cover panel 40 and the protective film 30 in the present embodiment may be improved. That is, because the protective film 30 and the silicon layer SL include materials having the same or similar properties, the protective film 30 and the silicon layer SL may have the same or similar properties. Accordingly, adhesion between the protective film 30 and the silicon layer SL may be improved.

According to an embodiment, a display apparatus having improved adhesion between a display panel and a cover panel protecting the display panel and a method of manufacturing the same may be implemented. The scope of the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
    preparing a preliminary cover panel;
    bonding the preliminary cover panel under a protective film bonded under a display panel and including a first silicon-based compound; and
    thermally curing the preliminary cover panel,
    wherein the preparing of the preliminary cover panel comprises:
    forming a preliminary cushion layer on an organic layer;
    forming a silicon-layer-forming layer by applying a silicon layer composition including a second silicon-based compound onto the preliminary cushion layer and performing heat treatment on the silicon layer composition; and
    forming a preliminary silicon layer by irradiating the silicon-layer-forming layer with ultraviolet light.

2. The method of claim 1, wherein a temperature at which the preliminary cover panel is thermally cured is lower than a temperature at which the heat treatment is performed on the silicon layer composition.

3. The method of claim 1, wherein the first silicon-based compound and the second silicon-based compound include a same material as each other.

4. The method of claim 3, wherein the first silicon-based compound and the second silicon-based compound include polydimethylsiloxane.

5. The method of claim 1, wherein the second silicon-based compound is different from the first silicon-based compound.

6. The method of claim 5, wherein the first silicon-based compound includes polydimethylsiloxane.

7. The method of claim 6, wherein the second silicon-based compound includes at least one of silica and silsesquioxane.

8. The method of claim 1, wherein the forming of the preliminary cushion layer comprises:
    forming a cushion-layer-forming layer by applying a cushion layer composition onto the organic layer and performing heat treatment on the cushion layer composition; and
    forming the preliminary cushion layer by irradiating the cushion-layer-forming layer with ultraviolet light.

9. The method of claim 8, wherein the thermally curing of the preliminary cover panel comprises thermally curing the preliminary cushion layer and the preliminary silicon layer.

* * * * *